US012609082B2

(12) United States Patent
Kim et al.

(10) Patent No.: US 12,609,082 B2
(45) Date of Patent: Apr. 21, 2026

(54) PIXEL AND DISPLAY DEVICE INCLUDING THE SAME

(71) Applicant: Samsung Display Co., Ltd., Yongin-Si (KR)

(72) Inventors: Hongsoo Kim, Yongin-si (KR);
Jin-Wook Yang, Yongin-si (KR);
Yu-Chol Kim, Yongin-si (KR);
Seongoh Yeom, Yongin-si (KR);
Eui-Myeong Cho, Yongin-si (KR);
Jakyoung Jin, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 18/950,222

(22) Filed: Nov. 18, 2024

(65) Prior Publication Data

US 2025/0174193 A1 May 29, 2025

(30) Foreign Application Priority Data

Nov. 23, 2023 (KR) ......................... 10-2023-0164656

(51) Int. Cl.
*G09G 3/3233* (2016.01)
*G09G 3/32* (2016.01)
*H10D 86/40* (2025.01)
*H10D 86/60* (2025.01)
*H10K 59/131* (2023.01)

(52) U.S. Cl.
CPC ............. *G09G 3/3233* (2013.01); *G09G 3/32* (2013.01); *G09G 2300/0465* (2013.01); *G09G 2300/0819* (2013.01); *G09G 2300/0852* (2013.01); *G09G 2300/0861* (2013.01); *G09G*

*2310/08* (2013.01); *G09G 2320/0247* (2013.01); *H10D 86/441* (2025.01); *H10D 86/60* (2025.01); *H10K 59/131* (2023.02)

(58) Field of Classification Search
CPC ......... G09G 3/3233; G09G 2300/0819; G09G 2300/0842; G09G 2300/0861; G09G 2310/08; G09G 2320/0233; G09G 3/3225; G09G 2320/0252; G09G 2320/0295; G09G 2320/0223; G09G 3/325; G09G 3/3648; G09G 2320/0238; G09G 2300/0452; G09G 3/3208; G09G 2320/029; G09G 2320/041
See application file for complete search history.

(56) References Cited

U.S. PATENT DOCUMENTS 11,961,463 B2 4/2024 Yang et al.
2015/0262526 A1* 9/2015 Park .................... G09G 3/3233
345/76

(Continued)

FOREIGN PATENT DOCUMENTS

KR 10-2024-0033711 A 3/2024

*Primary Examiner* — Sujit Shah
(74) *Attorney, Agent, or Firm* — Innovation Counsel LLP

(57) ABSTRACT

Disclosed is a pixel which includes a light emitting element, a first capacitor, a first transistor including a gate electrode connected to the first node, a second transistor including a gate electrode connected to a first scan line, a third transistor including a gate electrode connected to a second scan line, and a fourth transistor including a gate electrode connected to the second scan line. During a first initialization period, a first scan signal provided to the first scan line and a second scan signal provided to the second scan line are at an active level.

21 Claims, 23 Drawing Sheets

(56) References Cited

U.S. PATENT DOCUMENTS

| | | | | |
|---|---|---|---|---|
| 2022/0352296 A1* | 11/2022 | Yi | ........................ | G09G 3/035 |
| 2022/0376024 A1* | 11/2022 | Zheng | ................ | G09G 3/3266 |
| 2024/0212555 A1* | 6/2024 | Moon | ................ | G09G 3/3233 |
| 2024/0212598 A1* | 6/2024 | Zhao | ................ | H10K 59/1213 |

* cited by examiner

EMi

GIi

GCi

GWi

EBi

PIXEL AND DISPLAY DEVICE INCLUDING THE SAME

CROSS-REFERENCE TO RELATED APPLICATIONS

This application claims priority under 35 U.S.C. § 119 to Korean Patent Application No. 10-2023-0164656 filed on Nov. 23, 2023, in the Korean Intellectual Property Office, the disclosures of which are incorporated by reference herein in their entireties.

BACKGROUND

Embodiments of the present disclosure described herein relate to a pixel with improved display quality and a display device including the same.

A display device includes pixels connected to data lines and scan lines. Each of the pixels generally includes a light emitting element, and a pixel circuit for controlling a current flowing to the light emitting element. In response to a data signal, the pixel circuit controls the amount of current which flows from a first driving voltage to a second driving voltage through the light emitting element. Light emitted by the light emitting element has a luminance corresponding to the amount of current flowing through the light emitting element.

SUMMARY

Embodiments of the present disclosure provide a pixel with improved display quality and a display device including the same.

According to an embodiment, a pixel may include a light emitting element that includes a first electrode electrically connected to a first voltage line through which a first driving voltage is provided, a second electrode electrically connected to a second voltage line through which a second driving voltage whose voltage level is lower than a voltage level of the first driving voltage is provided, a first capacitor that is connected between a first node and a second node, a first transistor that includes a first electrode connected to a third node, a second electrode electrically connected to the first electrode of the light emitting element, and a gate electrode connected to the first node, a second transistor that includes a first electrode connected to the first node, a second electrode connected to a third voltage line, and a gate electrode connected to a first scan line, a third transistor that includes a first electrode connected to the first electrode of the light emitting element, a second electrode connected to a fifth voltage line, and a gate electrode connected to a second scan line, and a fourth transistor that includes a first electrode connected to a fourth voltage line, a second electrode connected to the third node, and a gate electrode connected to the second scan line. During a first initialization period, a first scan signal provided to the first scan line and a second scan signal provided to the second scan line may be at an active level.

In the first initialization period, a width of a second activation period of the second scan signal may be narrower than a width of a first activation period of the first scan signal.

During the first initialization period, a first initialization voltage may be provided from the third voltage line to the first node.

During the first initialization period, a second initialization voltage may be provided from the fifth voltage line to the first electrode of the light emitting element.

During the first initialization period, a bias voltage may be provided from the fourth voltage line to the third node.

The pixel may further include a fifth transistor including a first electrode connected to the first voltage line, a second electrode connected to the third node, and a gate electrode connected to a third scan line.

The pixel may further include a sixth transistor including a first electrode connected to the second electrode of the first transistor, a second electrode connected to the first node, and a gate electrode connected to the third scan line.

Each of the second transistor and the sixth transistor may include a plurality of transistors connected in series.

The pixel may further include a seventh transistor including a first electrode connected to the sixth voltage line through which a reference voltage is provided, a second electrode connected to the second node, and a gate electrode connected to the third scan line, and an eighth transistor including a first electrode connected to a data line, a second electrode connected to the second node, and a gate electrode connected to a fourth scan line.

The pixel may further include a ninth transistor including a first electrode connected to the first voltage line, a second electrode connected to the third node, and a gate electrode connected to an emission line, and a tenth transistor including a first electrode connected to the second electrode of the first transistor, a second electrode connected to the first electrode of the light emitting element, and a gate electrode connected to the emission line.

During a compensation period, a third scan signal provided to the third scan line may be at the active level, and the first driving voltage may be provided to the first node through the fifth transistor, the first transistor, and the sixth transistor.

The first initialization period and the compensation period may be alternately repeated plural times.

A plurality of first initialization periods may include a (1-1)-th initialization period and a (1-2)-th initialization period provided following the (1-1)-th initialization period. During the (1-1)-th initialization period, the bias voltage may have a first voltage level, and during the (1-2)-th initialization period, the bias voltage may have a second voltage level higher than the first voltage level.

During a second initialization period, the first scan signal may be at the active level.

The compensation period may be disposed between the first initialization period and the second initialization period.

During a data write period provided following the first initialization period and the compensation period, a fourth scan signal provided to the fourth scan line may be at the active level.

During a bias period provided following the data write period, the second scan signal may be at the active level.

During an emission period provided following the bias period, an emission signal provided to the emission line may be at the active level, and during the emission period, the light emitting element may emit a light.

According to an embodiment, a display device may include a display panel that includes a pixel connected to a plurality of scan lines, an emission line, and a data line, a driving circuit that drives the plurality of scan lines and the emission line in response to a scan control signal, a driving controller that outputs the scan control signal, and a voltage generator that generates a plurality of driving voltages. The pixel may include a light emitting element that includes a first electrode electrically connected to a first voltage line through which a first driving voltage is provided, a second electrode electrically connected to a second voltage line through which a second driving voltage whose voltage level is lower than a voltage level of the first driving voltage is provided, a first capacitor that is connected between a first node and a second node, a first transistor that includes a first electrode connected to a third node, a second electrode electrically connected to the first electrode of the light emitting element, and a gate electrode connected to the first node, a second transistor that includes a first electrode connected to the first node, a second electrode connected to a third voltage line through which a first initialization voltage is provided, and a gate electrode connected to a first scan line, a third transistor that includes a first electrode connected to the first electrode of the light emitting element, a second electrode connected to a fifth voltage line through which a second initialization voltage is provided, and a gate electrode connected to a second scan line, and a fourth transistor that includes a first electrode connected to a fourth voltage line, a second electrode connected to the third node, and a gate electrode connected to the second scan line. During a first initialization period, a first scan signal provided to the first scan line and a second scan signal provided to the second scan line may be at an active level.

During the first initialization period, a bias voltage may be provided from the fourth voltage line to the third node, a first initialization voltage may be provided from the third voltage line to the first node, and a second initialization voltage may be provided from the fifth voltage line to the first electrode of the light emitting element.

The pixel further may include a fifth transistor including a first electrode connected to the first voltage line, a second electrode connected to the third node, and a gate electrode connected to a third scan line, and a sixth transistor including a first electrode connected to the second electrode of the first transistor, a second electrode connected to the first node, and a gate electrode connected to the third scan line.

Each of the second transistor and the sixth transistor may include a plurality of transistors connected in series.

The pixel may further include a seventh transistor including a first electrode connected to a sixth voltage line through which a reference voltage is provided, a second electrode connected to the second node, and a gate electrode connected to the third scan line, an eighth transistor including a first electrode connected to the data line, a second electrode connected to the second node, and a gate electrode connected to a fourth scan line, a ninth transistor including a first electrode connected to the first voltage line, a second electrode connected to the third node, and a gate electrode connected to the emission line, and a tenth transistor including a first electrode connected to the second electrode of the first transistor, a second electrode connected to the first electrode of the light emitting element, and a gate electrode connected to the emission line.

During a compensation period, a third scan signal provided to the third scan line may be at the active level, and the first driving voltage may be provided to the first node through the fifth transistor, the first transistor, and the sixth transistor.

The first initialization period and the compensation period may be alternately repeated plural times. A plurality of first initialization periods may include a (1-1)-th initialization period and a (1-2)-th initialization period provided following the (1-1)-th initialization period. During the (1-1)-th initialization period, the bias voltage may have a first voltage level, and during the (1-2)-th initialization period, the bias voltage may have a second voltage level higher than the first voltage level.

BRIEF DESCRIPTION OF THE FIGURES

The above and other objects and features of the present disclosure will become apparent by describing in detail embodiments thereof with reference to the accompanying drawings.

FIG. 3 is a block diagram illustrating a first driving circuit according to an embodiment of the present disclosure.

FIG. 4 is a block diagram illustrating a second driving circuit according to an embodiment of the present disclosure.

FIGS. 8 and 9 are timing diagrams for describing an operation of a pixel according to an embodiment of the present disclosure.

FIG. 15 is a timing diagram for describing an operation of a pixel according to an embodiment of the present disclosure.

FIG. 16 is a timing diagram for describing an operation of a pixel according to an embodiment of the present disclosure.

DETAILED DESCRIPTION

Figure 1:
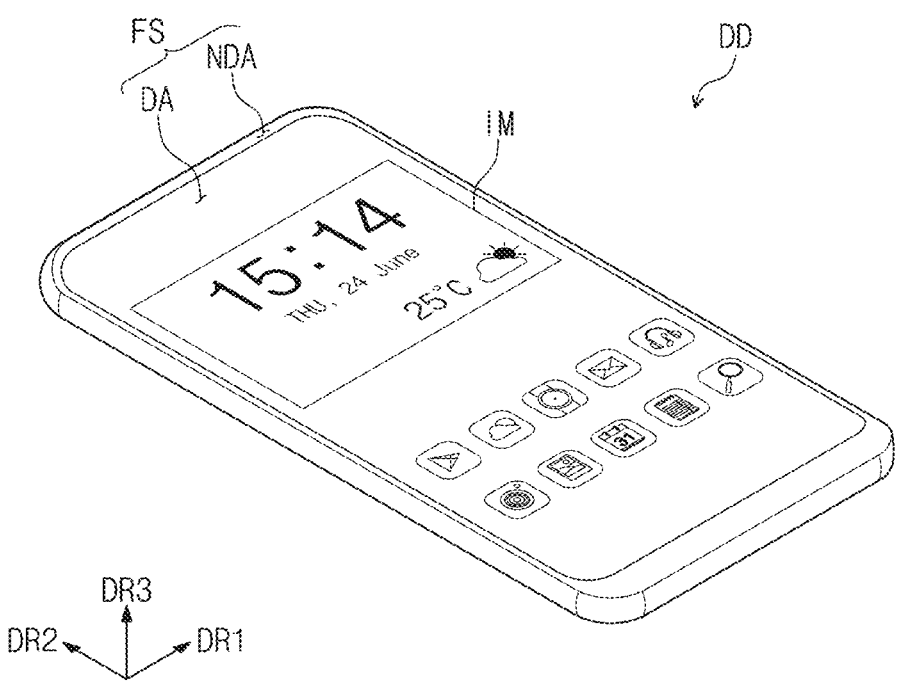
FIG. 1 is a perspective view illustrating a display device according to an embodiment of the present disclosure.

In the specification, the expression that a first component (or an area, a layer, a part, or a portion) is "on", "connected to", or "coupled to" a second component means that the first component is directly on/connected to/coupled to the second component or means that a third component is interposed therebetween.

The same reference numerals refer to the same components. In addition, in drawings, thicknesses, proportions, and dimensions of components may be exaggerated to describe the technical features effectively. As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

Although the terms "first", "second", etc. may be used to describe various components, the components should not be construed as being limited by the terms. The terms are only used to distinguish one component from another component. For example, without departing from the scope and spirit of the invention, a first component may be referred to as a "second component", and similarly, the second component may be referred to as the "first component". The singular forms are intended to include the plural forms unless the context clearly indicates otherwise.

Also, the terms "under", "below", "on", "above", etc. are used to describe the correlation of components illustrated in drawings. The terms that are relative in concept are described based on a direction shown in drawings.

It will be further understood that the terms "comprises", "includes", "have", etc. specify the presence of stated features, numbers, steps, operations, elements, components, or a combination thereof but do not preclude the presence or addition of one or more other features, numbers, steps, operations, elements, components, or a combination thereof.

Unless otherwise defined, all terms (including technical terms and scientific terms) used in the specification have the same meaning as commonly understood by one skilled in the art to which the present disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Below, embodiments of the present disclosure will be described with reference to drawings.

FIG. 1 is a perspective view of a display device according to an embodiment of the present disclosure.

Referring to FIG. 1, a display device DD may have a shape where short sides (or edges) extend in a first direction DR1 and long sides (or edges) extend in a second direction DR2 intersecting the first direction DR1. However, the shape of the display device DD is not limited thereto. For example, the display device DD may be implemented in various shapes.

The display device DD according to the present disclosure may be a small and medium-sized electronic device such as a mobile phone, a tablet, an automotive navigation system, or a game console, as well as a large-sized electronic device such as a television or a monitor. The above examples are provided only as an embodiment, and it is obvious that the display device DD is capable of being applied to any other electronic device(s) without departing from the scope and spirit of the invention.

Figure 2:
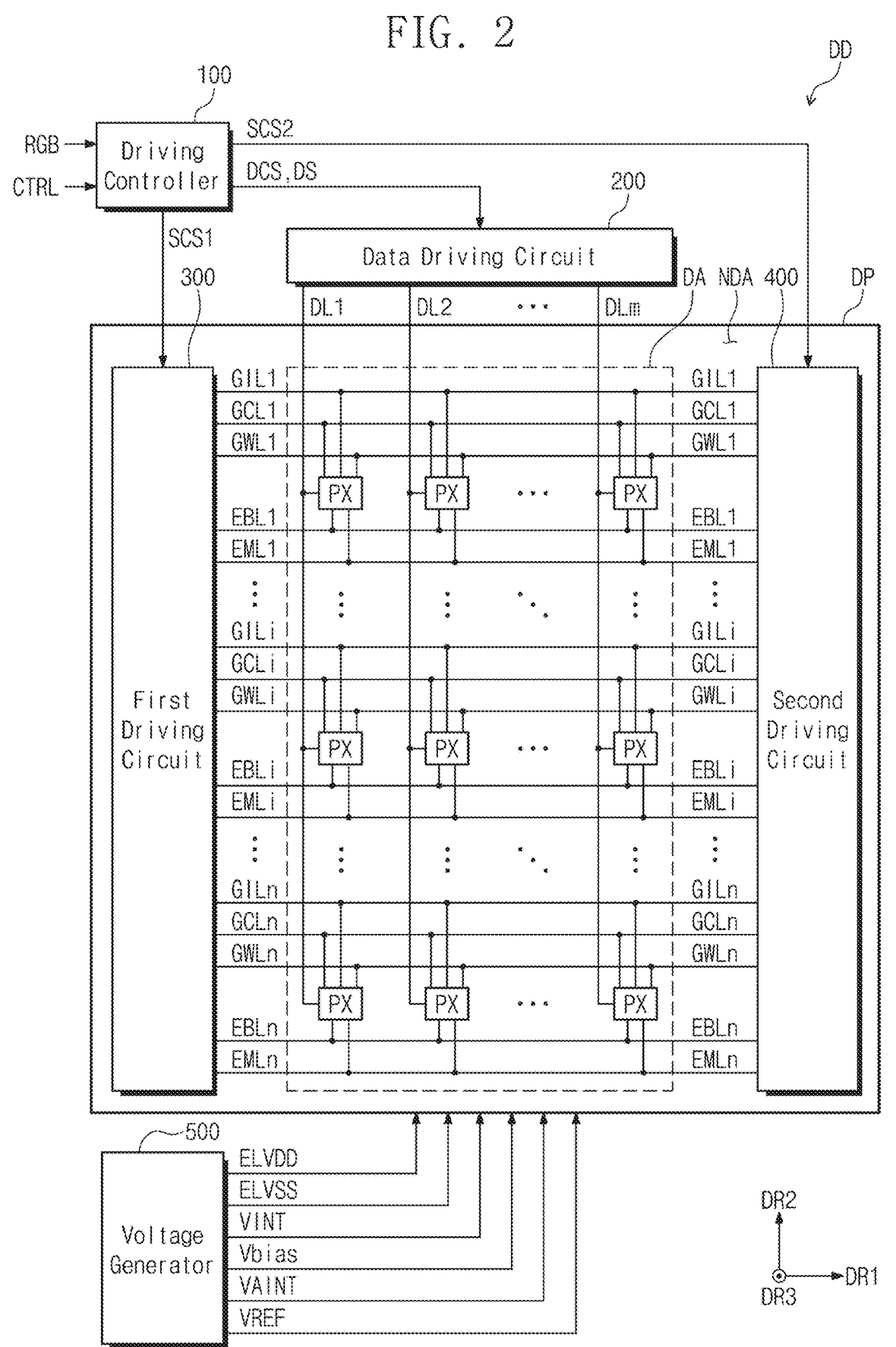
FIG. 2 is a block diagram of a display device according to an embodiment of the present disclosure.

The display device DD may include a display panel DP (refer to FIG. 2). The display panel DP (refer to FIG. 2) may display an image IM on a display surface FS parallel to each of the first direction DR1 and the second direction DR2, so as to face a third direction DR3 intersecting the first direction DR1 and the second direction DR2. The display surface FS on which the image IM is displayed may correspond to a front surface of the display device DD.

The display surface FS of the display panel DP (refer to FIG. 2) may be divided into a plurality of areas. A display area DA and a non-display area NDA may be defined on the display surface FS of the display device DD.

The display area DA may be an area where the image IM is displayed, and the user may visually perceive the image IM through the display area DA. A shape of the display area DA may be defined substantially by the non-display area NDA. However, this is illustrated as an example, and the non-display area NDA may be only disposed adjacent to one side of the display area DA or may be omitted. The display device DD according to an embodiment of the present disclosure may include various embodiments and is not limited to any one embodiment.

The non-display area NDA which is an area adjacent to the display area DA may be an area where the image IM is not displayed. A bezel area of the display device DD may be defined by the non-display area NDA.

The non-display area NDA may surround the display area DA. However, this is illustrated as an example. The non-display area NDA may be only disposed adjacent to a portion of the border of the display area DA or may be omitted.

FIG. 2 is a block diagram of a display device according to an embodiment of the present disclosure.

Referring to FIG. 2, the display device DD includes the display panel DP, a driving controller 100, a data driving circuit 200, and a voltage generator 500.

The display panel DP according to an embodiment of the present disclosure may be a light emitting display panel, but the present disclosure is not limited thereto. For example, the display panel DP may be an organic light emitting display panel, a quantum dot light emitting display panel, a micro-LED display panel, or a nano-LED display panel. A light emitting layer of the organic light emitting display panel may include an organic light emitting material. A light emitting layer of the quantum dot light emitting display panel may include a quantum dot, a quantum rod, etc. A light emitting layer of the micro-LED display panel may include a micro-LED. A light emitting layer of the nano-LED display panel may include a nano-LED.

The driving controller 100 may receive an input signal including an input image signal RGB and a control signal CTRL. The driving controller 100 may generate an output image signal DS by converting a data format of the input image signal RGB in compliance with the specification for an interface with the data driving circuit 200. The driving controller 100 may output a first scan control signal SCS1, a second scan control signal SCS2, and a data control signal DCS for controlling the display panel DP such that an image is capable of being displayed.

Each of the first scan control signal SCS1 and the second scan control signal SCS2 may include a plurality of clock signals and a plurality of start signals.

The data driving circuit 200 may receive the data control signal DCS and the output image signal DS from the driving controller 100. The data driving circuit 200 may convert the output image signal DS into data signals and may output the data signals to a plurality of data lines DL1 to DLm to be described later. The data signals refer to analog voltages corresponding to a gray value of the output image signal DS.

The voltage generator 500 may generate voltages necessary for the operation of the display panel DP. In an embodiment, the voltage generator 500 generates a first driving voltage ELVDD, a second driving voltage ELVSS, a first initialization voltage VINT, a second initialization voltage VAINT, a reference voltage VREF, and a bias voltage Vbias.

The display panel DP may include scan lines GIL1 to GILn, GCL1 to GCLn, GWL1 to GWLn, and EBL1 to EBLn, emission lines EML1 to EMLn, the data lines DL1 to DLm, and pixels PX. The display panel DP may include a first driving circuit 300 and a second driving circuit 400. In an embodiment, the first driving circuit 300 is disposed on a first side of the display panel DP, and the second driving circuit 400 is disposed on a second side of the display panel DP. The scan lines GIL1 to GILn, GCL1 to GCLn, GWL1 to GWLn, and EBL1 to EBLn and the emission lines EML1 to EMLn may be electrically connected to the first driving circuit 300 and the second driving circuit 400. The data lines DL1 to DLm may be electrically connected to the data driving circuit 200.

The scan lines GIL1 to GILn, GCL1 to GCLn, GWL1 to GWLn, and EBL1 to EBLn and the emission lines EML1 to EMLn extend in the first direction and are arranged to be spaced from each other in the second direction DR2. The data lines DL1 to DLm extend in the second direction DR2 and are arranged to be spaced from each other in the first direction DR1.

In the example illustrated in FIG. 2, the first driving circuit 300 and the second driving circuit 400 are disposed to face each other, with the pixels PX interposed therebetween. However, the present disclosure is not limited thereto. In another embodiment, the display panel DP may only include one of the first driving circuit 300 and the second driving circuit 400.

The plurality of pixels PX are electrically connected to the scan lines GIL1 to GILn, GCL1 to GCLn, GWL1 to GWLn, and EBL1 to EBLn, the emission lines EML1 to EMLn, and the data lines DL1 to DLm. Each of the plurality of pixels PX may be electrically connected to four scan lines and one emission line. For example, as illustrated in FIG. 1, the pixels PX belonging to the first row may be connected to the scan lines GIL1, GCL1, GWL1, and GBL1 and the emission line EML1. Also, the pixels PX belonging to the i-th row may be connected to the scan lines GILi, GCLi, GWLi, and EBLi and the emission line EMLi.

Each of the plurality of pixels PX includes a light emitting element ED (refer to FIG. 5) and a pixel circuit controlling the emission of the light emitting element ED. The pixel circuit may include one or more transistors and one or more capacitors. The first driving circuit 300 and the second driving circuit 400 may include transistors formed through the same process as the transistors of the pixel circuit.

Each of the plurality of pixels PX may receive the first driving voltage ELVDD, the second driving voltage ELVSS, the first initialization voltage VINT, the second initialization voltage VAINT, the reference voltage VREF, and the bias voltage Vbias.

The first driving circuit 300 may receive the first scan control signal SCS1 from the driving controller 100. In response to the first scan control signal SCS1, the first driving circuit 300 may output scan signals to the scan lines GIL1 to GILn, GCL1 to GCLn, GWL1 to GWLn, and EBL1 to EBLn and may output emission signals to the emission lines EML1 to EMLn.

The second driving circuit 400 may receive the second scan control signal SCS2 from the driving controller 100. In response to the second scan control signal SCS2, the second driving circuit 400 may output scan signals to the scan lines GIL1 to GILn, GCL1 to GCLn, GWL1 to GWLn, and EBL1 to EBLn and may output emission signals to the emission lines EML1 to EMLn.

In an embodiment, the scan signals output from the first driving circuit 300 to the scan lines GIL1 to GILn, GCL1 to GCLn, GWL1 to GWLn, and EBL1 to EBLn and the emission signals output from the first driving circuit 300 to the emission lines EML1 to EMLn may be substantially the same as the scan signals output from the second driving circuit 400 to the scan lines GIL1 to GILn, GCL1 to GCLn, GWL1 to GWLn, and EBL1 to EBLn and the emission signals output from the second driving circuit 400 to the emission lines EML1 to EMLn, respectively.

In an embodiment, the display panel DP may only include one of the first driving circuit 300 and the second driving circuit 400.

Figure 3:
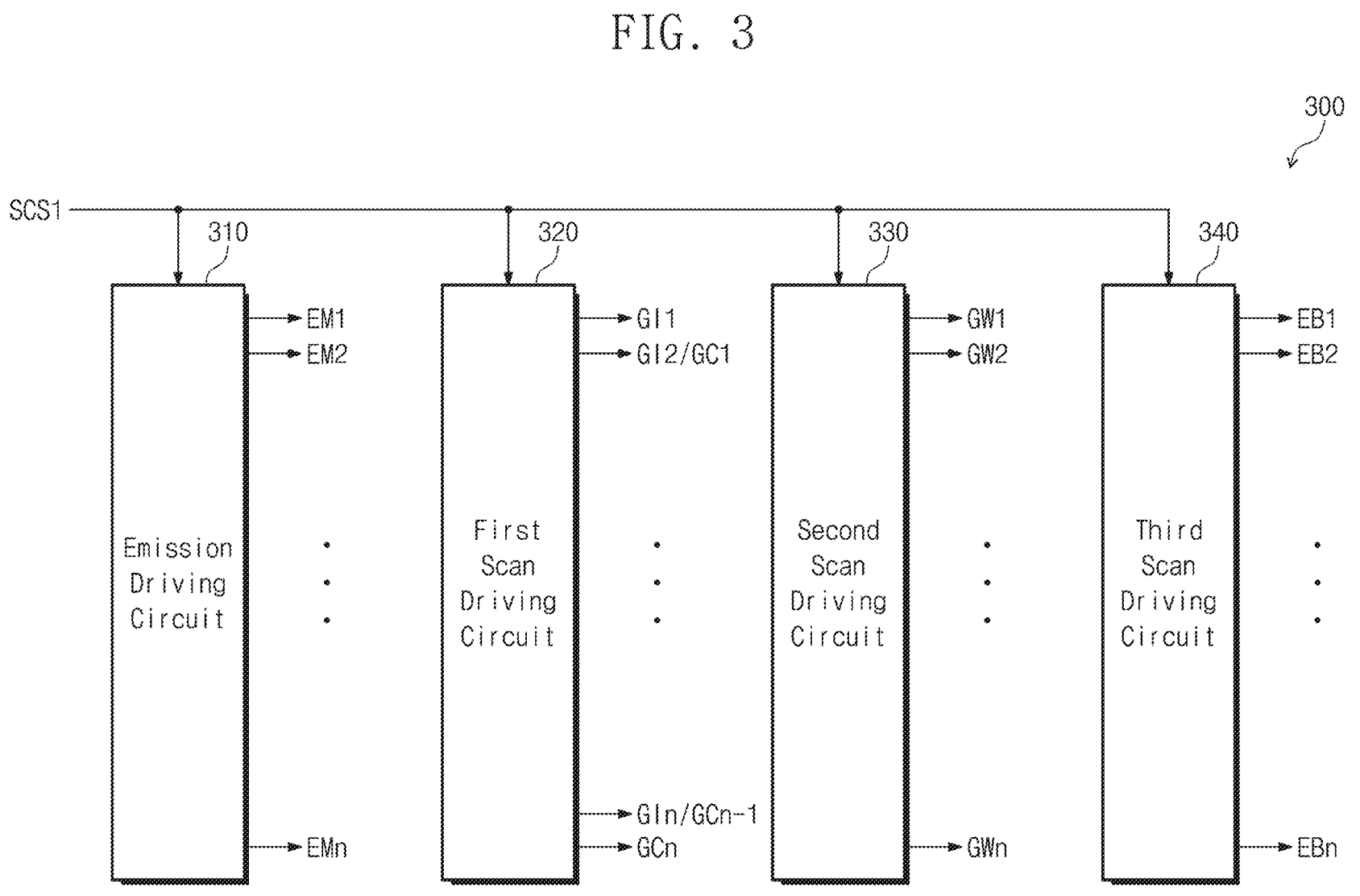

FIG. 3 is a block diagram illustrating a first driving circuit according to an embodiment of the present disclosure.

Referring to FIG. 3, the first driving circuit 300 may include an emission driving circuit 310, a first scan driving circuit 320, a second scan driving circuit 330, and a third scan driving circuit 340.

The emission driving circuit 310 may receive at least one corresponding clock signal among the plurality of clock signals and a corresponding start signal among the plurality of start signals through the first scan control signal SCS1. The emission driving circuit 310 may output emission control signals EM1 to EMn to be provided to the emission lines EML1 to EMLn illustrated in FIG. 2 in response to the first scan control signal SCS1.

The first scan driving circuit 320 may receive at least one corresponding clock signal among the plurality of clock signals and a corresponding start signal among the plurality of start signals through the first scan control signal SCS1. In response to the first scan control signal SCS1, the first scan driving circuit 320 may output scan signals GI1 to GIn to be provided to the scan lines GIL1 to GILn illustrated in FIG. 2 and scan signals GC1 to GCn to be provided to the scan lines GCL1 to GCLn illustrated in FIG. 2. Some of the scan signals GI1 to GIn may be identical to some of the scan signals GC1 to GCn. For example, the scan signal GI2 may be identical to the scan signal GC1, and the scan signal GIn may be identical to the scan signal GCn−1.

The second scan driving circuit 330 may receive at least one corresponding clock signal among the plurality of clock signals and a corresponding start signal among the plurality of start signals through the first scan control signal SCS1. The second scan driving circuit 330 may output scan signals GW1 to GWn to be provided to the scan lines GWL1 to GWLn illustrated in FIG. 2 in response to the first scan control signal SCS1.

The third scan driving circuit 340 may receive at least one corresponding clock signal among the plurality of clock signals and a corresponding start signal among the plurality of start signals through the first scan control signal SCS1. The third scan driving circuit 340 may output scan signals EB1 to EBn to be provided to the scan lines EBL1 to EBLn illustrated in FIG. 2 in response to the first scan control signal SCS1.

Figure 4:
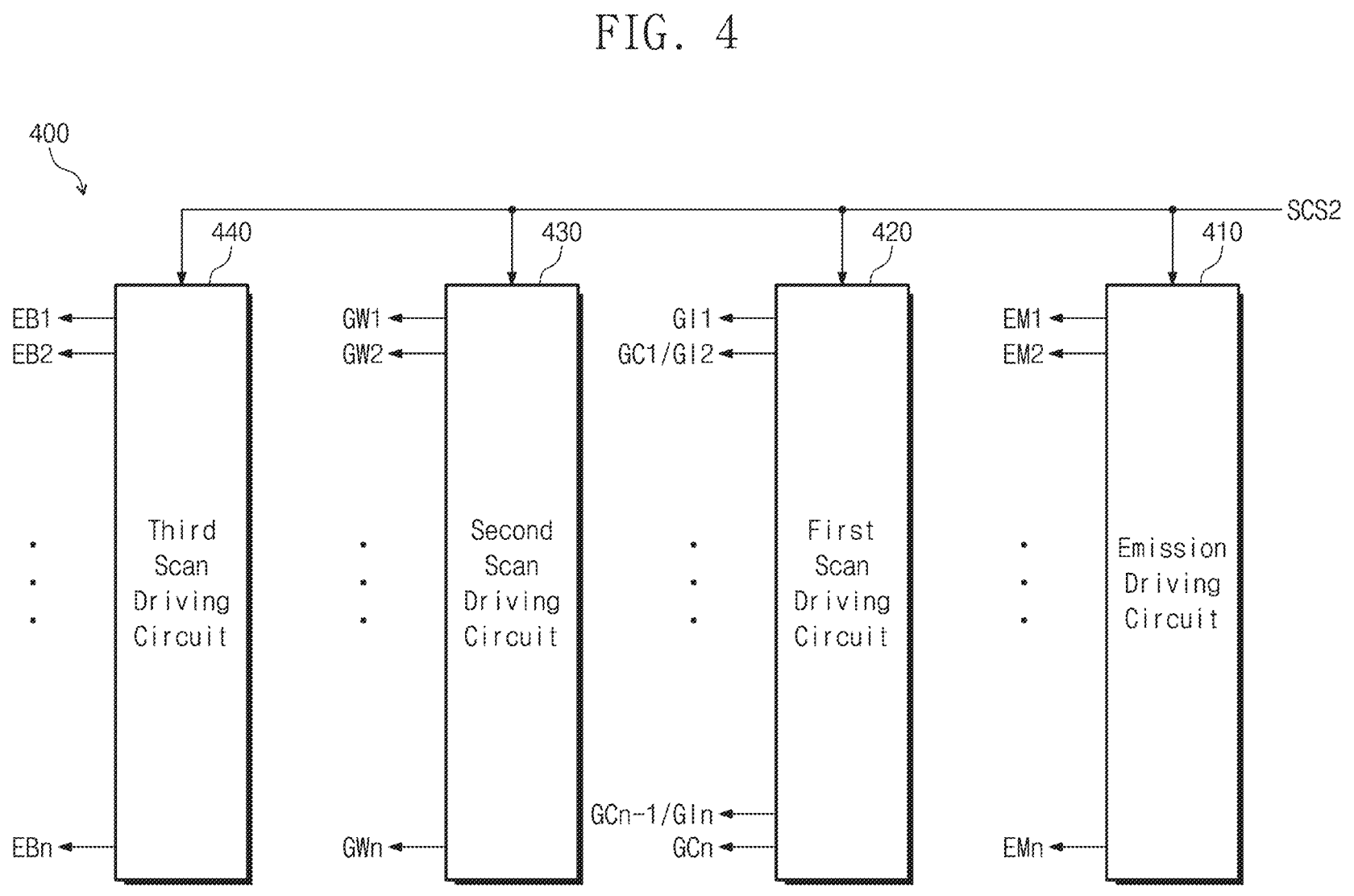

FIG. 4 is a block diagram illustrating a second driving circuit according to an embodiment of the present disclosure.

Referring to FIG. 4, the second driving circuit 400 may include an emission driving circuit 410, a first scan driving circuit 420, a second scan driving circuit 430, and a third scan driving circuit 440.

The emission driving circuit 410 may receive at least one corresponding clock signal among the plurality of clock signals and a corresponding start signal among the plurality of start signals through the second scan control signal SCS2. The emission driving circuit 410 may output the emission control signals EM1 to EMn to be provided to the emission lines EML1 to EMLn illustrated in FIG. 2 in response to the second scan control signal SCS2.

The first scan driving circuit 420 may receive at least one corresponding clock signal among the plurality of clock signals and a corresponding start signal among the plurality of start signals through the second scan control signal SCS2. In response to the second scan control signal SCS2, the first scan driving circuit 420 may output the scan signals GI1 to GIn to be provided to the scan lines GIL1 to GILn illustrated in FIG. 2 and the scan signals GC1 to GCn to be provided to the scan lines GCL1 to GCLn illustrated in FIG. 2. Some of the scan signals GI1 to GIn may be the same as some of the scan signals GC1 to GCn. For example, the scan signal GI2 may be identical to the scan signal GC1, and the scan signal GIn may be identical to the scan signal GCn−1.

The second scan driving circuit 430 may receive at least one corresponding clock signal among the plurality of clock signals and a corresponding start signal among the plurality of start signals through the second scan control signal SCS2. The second scan driving circuit 430 may output the scan signals GW1 to GWn to be provided to the scan lines GWL1 to GWLn illustrated in FIG. 2 in response to the second scan control signal SCS2.

The third scan driving circuit 440 may receive at least one corresponding clock signal among the plurality of clock signals and a corresponding start signal among the plurality of start signals through the second scan control signal SCS2. The third scan driving circuit 440 may output the scan signals EB1 to EBn to be provided to the scan lines EBL1 to EBLn illustrated in FIG. 2 in response to the second scan control signal SCS2.

Figure 5:
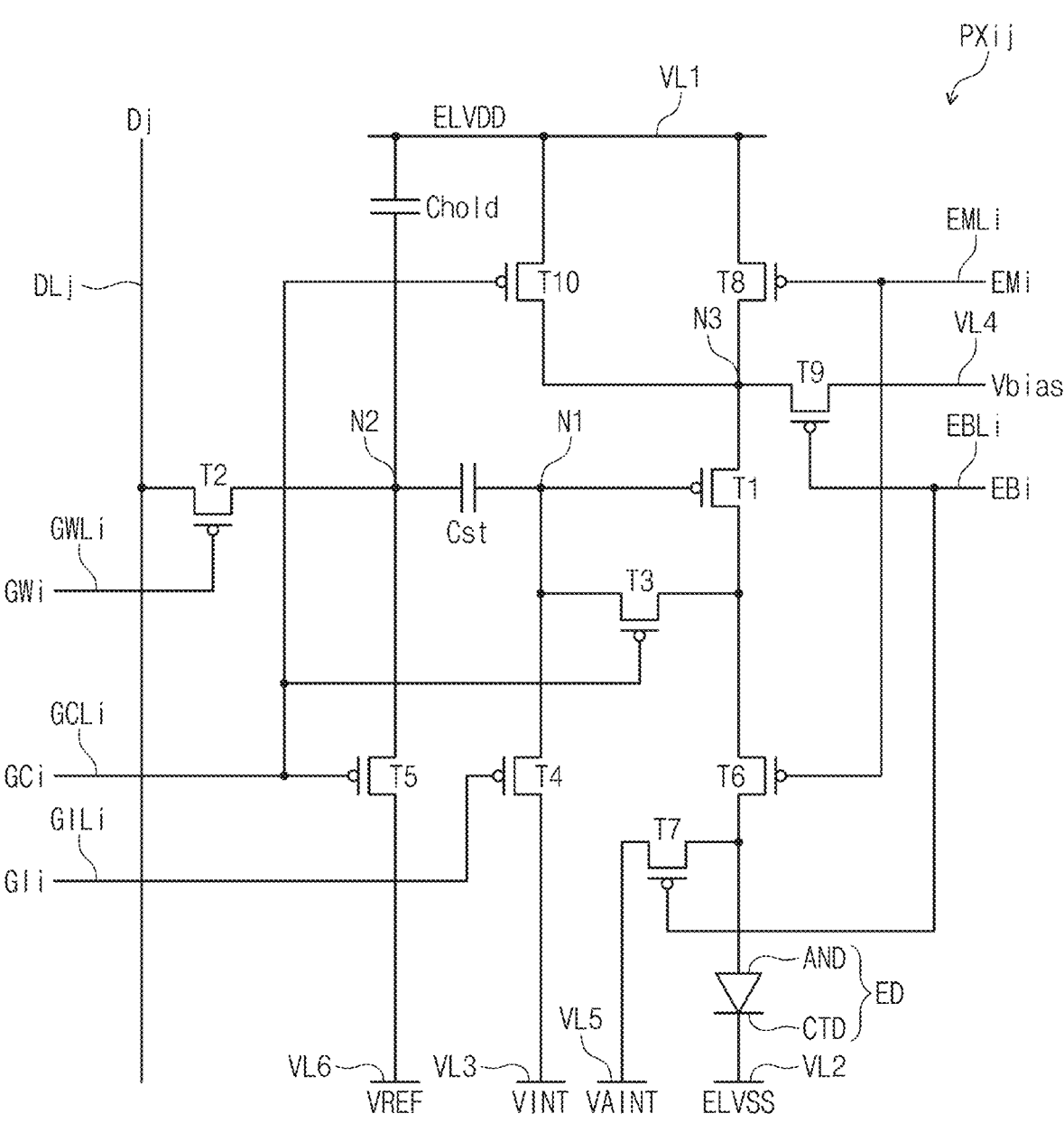
FIG. 5 is a circuit diagram of a pixel according to an embodiment of the present disclosure.

FIG. 5 is a circuit diagram of a pixel according to an embodiment of the present disclosure.

A pixel PXij which is connected to the j-th data line DLj, the i-th scan lines GILi, GCLi, GWLi, and EBLi, and the i-th emission line EMLi of FIG. 2 is illustrated in FIG. 5 as an example.

Each of the plurality of pixels PX illustrated in FIG. 2 may have the same circuit configuration as the pixel PXij illustrated in FIG. 5. In an embodiment, the pixel PXij includes the light emitting element ED and the pixel circuit. In an embodiment, the light emitting element ED may be a light emitting diode. The light emitting element ED may include a first electrode AND and a second electrode CTD. The first electrode AND may be referred to as an "anode", and the second electrode CTD may be referred to as a "cathode".

In an embodiment, the pixel circuit of the pixel PXij includes 10 transistors T1 to T10, a first capacitor Cst, and a second capacitor Chold. That is, the pixel circuit of the pixel PXij may be defined as having a "10T2C" structure. The circuit configuration of the pixel PXij according to the present disclosure is not limited to FIG. 5. The number of transistors included in the pixel PXij or the number of capacitors included in the pixel PXij and a connection relationship between the transistors and the capacitors may be variously changed or modified.

Referring to FIG. 5, in an embodiment, each of the first to tenth transistors T1 to T10 may be a P-type transistor having a low-temperature polycrystalline silicon (LTPS) semiconductor layer. However, the present disclosure is not limited thereto. In an embodiment, each of the first to tenth transistors T1 to T10 may be an N-type transistor using an oxide semiconductor as a semiconductor layer. In another embodiment, at least one of the first to tenth transistors T1 to T10 may be an N-type transistor, and the remaining transistors may be P-type transistors.

The scan lines GILi, GCLi, GWLi, and EBLi may respectively transfer the scan signals GIi, GCi, GWi, and EBi, and the emission line EMLi may transfer the emission signal EMi. The data line DLj transfers a data signal Dj. The data signal Dj may have a voltage level corresponding to the input image signal RGB input to the display device DD (refer to FIG. 1). First to sixth voltage lines VL1, VL2, VL3, VL4, VL5, and VL6 may respectively transfer the first driving voltage ELVDD, the second driving voltage ELVSS, the first initialization voltage VINT, the bias voltage Vbias, the second initialization voltage VAINT, and the reference voltage VREF.

The first transistor T1 may include a first electrode connected to the first voltage line VL1 through the eighth transistor T8, a second electrode electrically connected to the first electrode AND of the light emitting element ED through the sixth transistor T6, a gate electrode connected to a first node N1.

The second transistor T2 includes a first electrode connected to the data line DLj, a second electrode connected to a second node N2, and a gate electrode connected to the scan line GWLi. The second transistor T2 may be turned on depending on the scan signal GWi transferred through the scan line GWLi and may transfer the data signal Dj transferred through the data line DLj to the second node N2.

The third transistor T3 includes a first electrode connected to the first electrode AND of the light emitting element ED through the sixth transistor T6, a second electrode connected to the first node N1, and a gate electrode connected to the scan line GCLi. The first electrode of the third transistor T3 may be connected to the second electrode of the first transistor T1. The third transistor T3 may be turned on depending on the scan signal GCi transferred through the scan line GCLi and may connect the first node N1, that is, the gate electrode of the first transistor T1 and the second electrode of the first transistor T1.

The fourth transistor T4 may include a first electrode connected to the first node N1, a second electrode connected to the third voltage line VL3, and a gate electrode connected to the scan line GILi. The fourth transistor T4 may be turned on depending on the scan signal GIi transferred through the scan line GILi and may transfer the first initialization voltage VINT to the first node N1, that is, the gate electrode of the first transistor T1.

The fifth transistor T5 includes a first electrode connected to the sixth voltage line VL6, a second electrode connected to the second node N2, and a gate electrode connected with the scan line GCLi. The fifth transistor T5 may be turned on depending on the scan signal GCi transferred through the scan line GCLi and may transfer the reference voltage VREF of the sixth voltage line VL6 to the second node N2.

The first electrode of the fifth transistor T5 according to an embodiment of the present disclosure may be connected to the first voltage line VL1 instead of the sixth voltage line VL6.

The sixth transistor T6 includes a first electrode connected to the second electrode of the first transistor T1, a second electrode connected to the first electrode AND of the light emitting element ED, and a gate electrode connected to the emission line EMLi.

The seventh transistor T7 includes a first electrode connected to the first electrode AND of the light emitting element ED, a second electrode connected to the fifth voltage line VL5, and a gate electrode connected to the scan line EBLi. The seventh transistor T7 may be turned on depending on the scan signal EBi transferred through the scan line EBLi and may initialize the first electrode AND of the light emitting element ED with the second initialization voltage VAINT of the fifth voltage line VL5.

The eighth transistor T8 includes a first electrode connected to the first voltage line VL1, a second electrode connected to the first electrode of the first transistor T1, and a gate electrode connected to the emission line EMLi.

The sixth transistor T6 and the eighth transistor T8 may be simultaneously turned on depending on the emission signal EMi transferred through the emission line EMLi. When the sixth transistor T6 and the eighth transistor T8 are turned on, a current path may be formed between the first voltage line VL1 and the light emitting element ED through the eighth transistor T8, the first transistor T1, and the sixth transistor T6.

The ninth transistor T9 includes a first electrode connected to the fourth voltage line VL4, a second electrode connected to the first electrode of the first transistor T1, and a gate electrode connected to the scan line EBLi. The ninth transistor T9 may be turned on depending on the scan signal EBi transferred through the scan line EBLi and may transfer the bias voltage Vbias to the first electrode of the first transistor T1.

The tenth transistor T10 includes a first electrode connected to the first voltage line VL1, a second electrode connected to the first electrode of the first transistor T1, and a gate electrode connected to the scan line GCLi. The tenth transistor T10 may be turned on depending on the scan signal GCi transferred through the scan line GCLi and may transfer the first driving voltage ELVDD to the first electrode of the first transistor T1.

The first capacitor Cst is connected between the first node N1 and the second node N2.

The second capacitor Chold is connected between the first voltage line VL1 and the second node N2.

Figure 6:
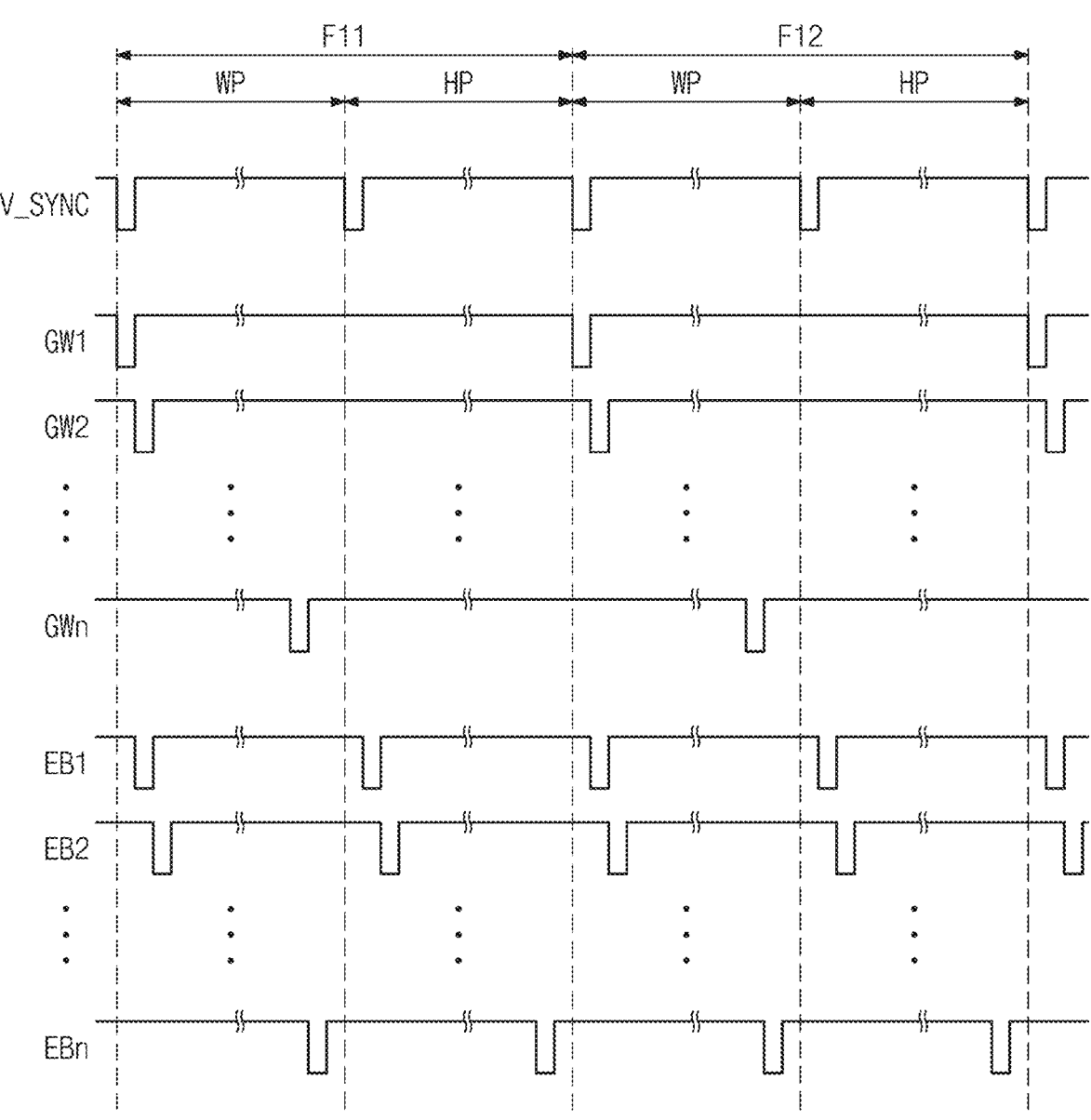
FIGS. 6 and 7 are timing diagrams for describing an operation of a display device according to an embodiment of the present disclosure.
Figure 7:
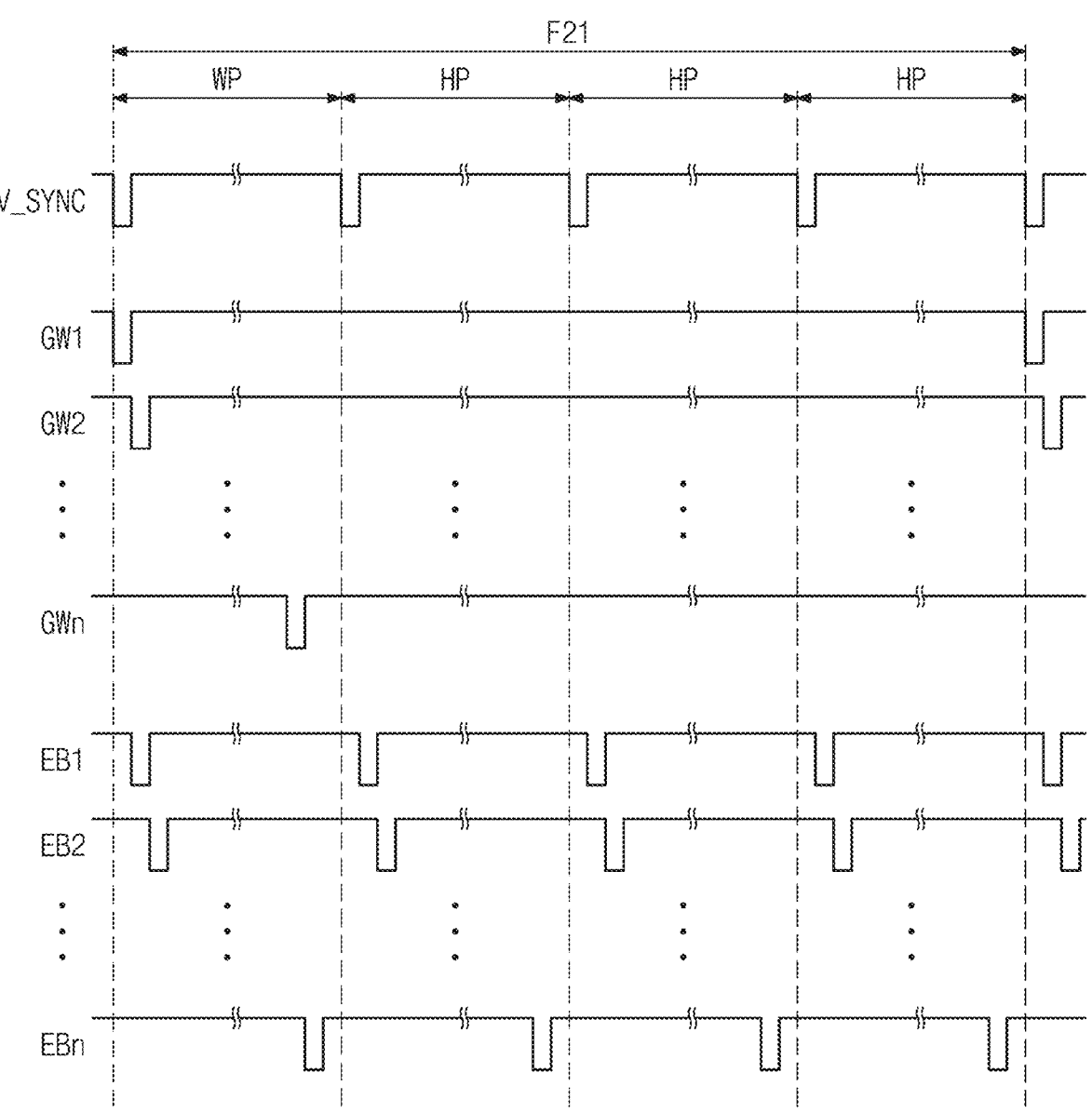

FIGS. 6 and 7 are timing diagrams for describing an operation of a display device according to an embodiment of the present disclosure.

Referring to FIGS. 2, 6, and 7, below, an example in which the display panel DP operates at a first driving frequency (e.g., 240 Hz) and a second driving frequency (e.g., 120 Hz) will be described. However, the present disclosure is not limited thereto. The driving frequency of the display panel DP may be variously changed. In an embodiment, one of the first driving frequency and the second driving frequency may be selected as the driving frequency of the display panel DP. Also, the display panel DP may operate in a variable frequency mode in which the driving frequency is frequently changed during the operation of the display panel DP without being fixed to a specific frequency. In an embodiment, the driving frequency of the display panel DP may be determined depending on the frequency of the input image signal RGB or the control signal CTRL.

The driving controller 100 provides the first scan control signal SCS1 and the second scan control signal SCS2 to the first driving circuit 300 and the second driving circuit 400, respectively, in response to the control signal CTRL. The control signal CTRL may include a synchronization signal V_SYNC. The first driving circuit 300 may output scan signals corresponding to the driving frequency in response to the first scan control signal SCS1, and the second driving circuit 400 may output scan signals corresponding to the driving frequency in response to the second scan control signal SCS2.

The scan signals GW1 to GWn illustrated in FIGS. 6 and 7 may be respectively provided to the scan lines GWL1 to GWLn illustrated in FIG. 2, and the scan signals EB1 to EBn may be respectively provided to the scan lines EBL1 to EBLn illustrated in FIG. 2.

FIG. 6 is a timing diagram of a start signal and scan signals when the driving frequency of the display panel DP is the first driving frequency (e.g., 240 Hz).

Referring to FIGS. 2 and 6, when the driving frequency is the first driving frequency (e.g., 240 Hz), each of frames F11 and F12 may include one write period WP and one hold period HP. The synchronization signal V_SYNC may refer to a signal indicating the start of each of the write period WP and the hold period HP.

In the write period WP of each of the frames F11 and F12, the first driving circuit 300 and the second driving circuit 400 sequentially activate the scan signals GW1 to GWn to an active level (e.g., a low level) and sequentially activate the scan signals EB1 to EBn to the low level. Although the scan signals GW1 to GWn and the scan signals EB1 to EBn are only illustrated in FIG. 6, the scan signals to be provided to the scan lines GCL1 to GCLn and GBL1 to GBLn and the emission signals to be provided to the emission lines EML1 to EMLn may also be sequentially activated in the write period WP of each of the frames F11 and F12.

During the hold period HP, the first driving circuit 300 and the second driving circuit 400 may maintain the scan signals GW1 to GWn at an inactive level (e.g., a high level) and may sequentially activate the scan signals EB1 to EBn. Although not illustrated in FIG. 6, during the hold period HP, the first driving circuit 300 and the second driving circuit 400 may maintain the scan signals to be provided to the scan lines GCL1 to GCLn and GBL1 to GBLn and the emission signals to be provided to the emission lines EML1 to EMLn at the inactive level (e.g., the high level), to be identical to the scan signals GW1 to GWn.

During the hold period HP, the first driving circuit 300 and the second driving circuit 400 may sequentially activate the scan signals EB1 to EBn. In other words, during the hold period HP of each of the frames F11 and F12, only the scan signals EB1 to EBn may be sequentially activated, and the remaining scan signals and the emission signals may be maintained at the inactive level.

FIG. 7 is a timing diagram of a start signal and scan signals when the driving frequency of the display panel DP is the second driving frequency (e.g., 120 Hz).

Referring to FIGS. 2 and 7, when the driving frequency is the second driving frequency (e.g., 120 Hz), the period (or duration) of a frame F21 may be two times the period of each of the frames F11 and F12 illustrated in FIG. 6. The frame F21 may include one write period WP and three hold periods HP. During the write period WP of the frame F21, the first driving circuit 300 and the second driving circuit 400 sequentially activate the scan signals GW1 to GWn to the low level and sequentially activate the scan signals EB1 to EBn to the low level. Although the scan signals GW1 to GWn and the scan signals EB1 to EBn are only illustrated in FIG. 7, the scan signals to be provided to the scan lines GCL1 to GCLn and GBL1 to GBLn and the emission signals to be provided to the emission lines EML1 to EMLn may also be sequentially activated in the write period WP of the frame F21.

During the hold period HP, the first driving circuit 300 and the second driving circuit 400 may maintain the scan signals GW1 to GWn at the inactive level (e.g., the high level) and may sequentially activate the scan signals EB1 to EBn. Although not illustrated in FIG. 7, during the hold period HP, the first driving circuit 300 and the second driving circuit 400 may maintain the scan signals to be provided to the scan lines GCL1 to GCLn and GBL1 to GBLn and the emission signals to be provided to the emission lines EML1 to EMLn at the inactive level (e.g., the high level), to be identical to the scan signals GW1 to GWn.

During the hold period HP, the first driving circuit 300 and the second driving circuit 400 may sequentially activate the scan signals EB1 to EBn. In other words, during each of the three hold periods HP of the frame F21, only the scan signals EB1 to EBn may be sequentially activated, and the returning scan signals and the emission signals may be maintained at the inactive level.

Figure 8:
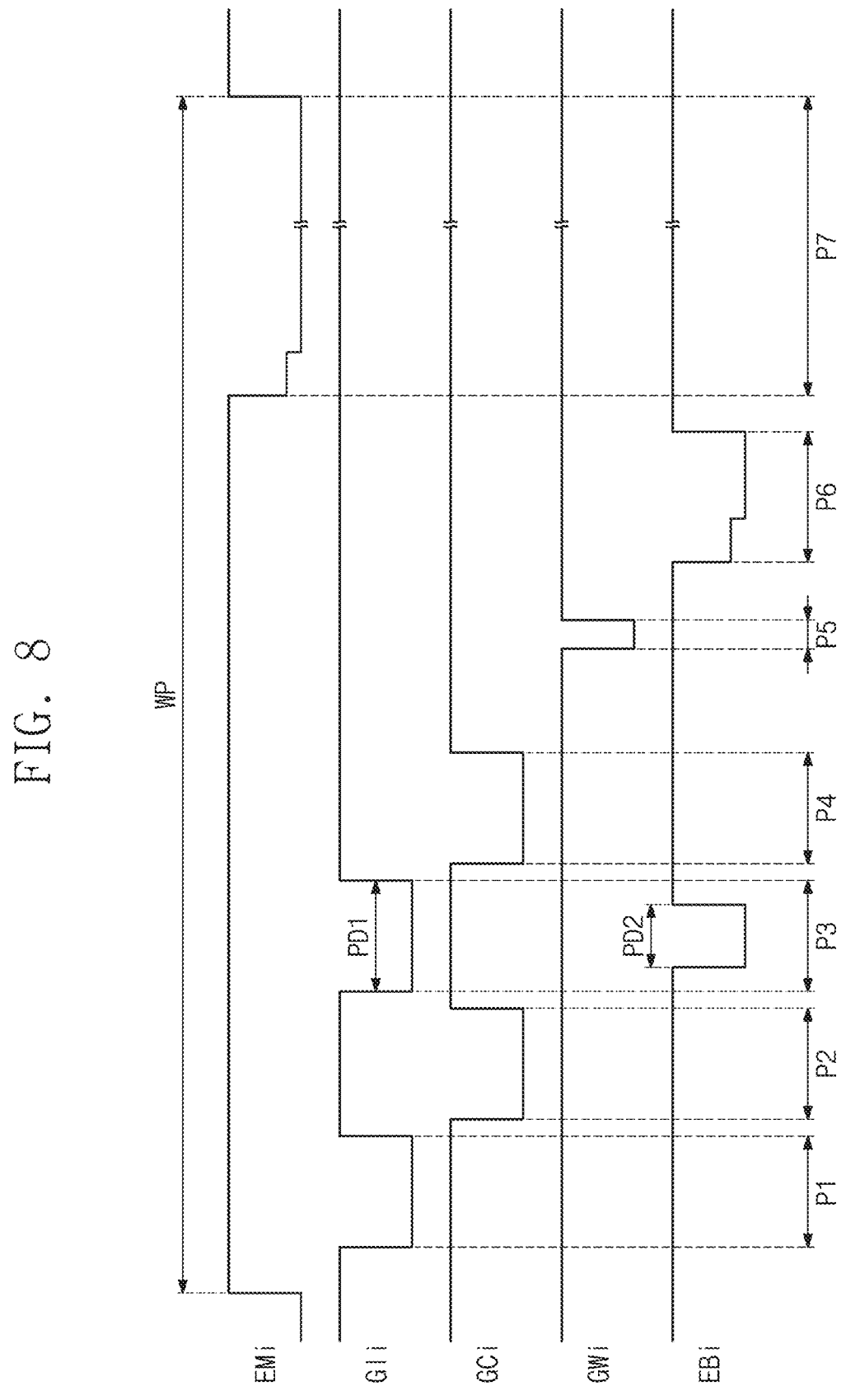
Figure 9:
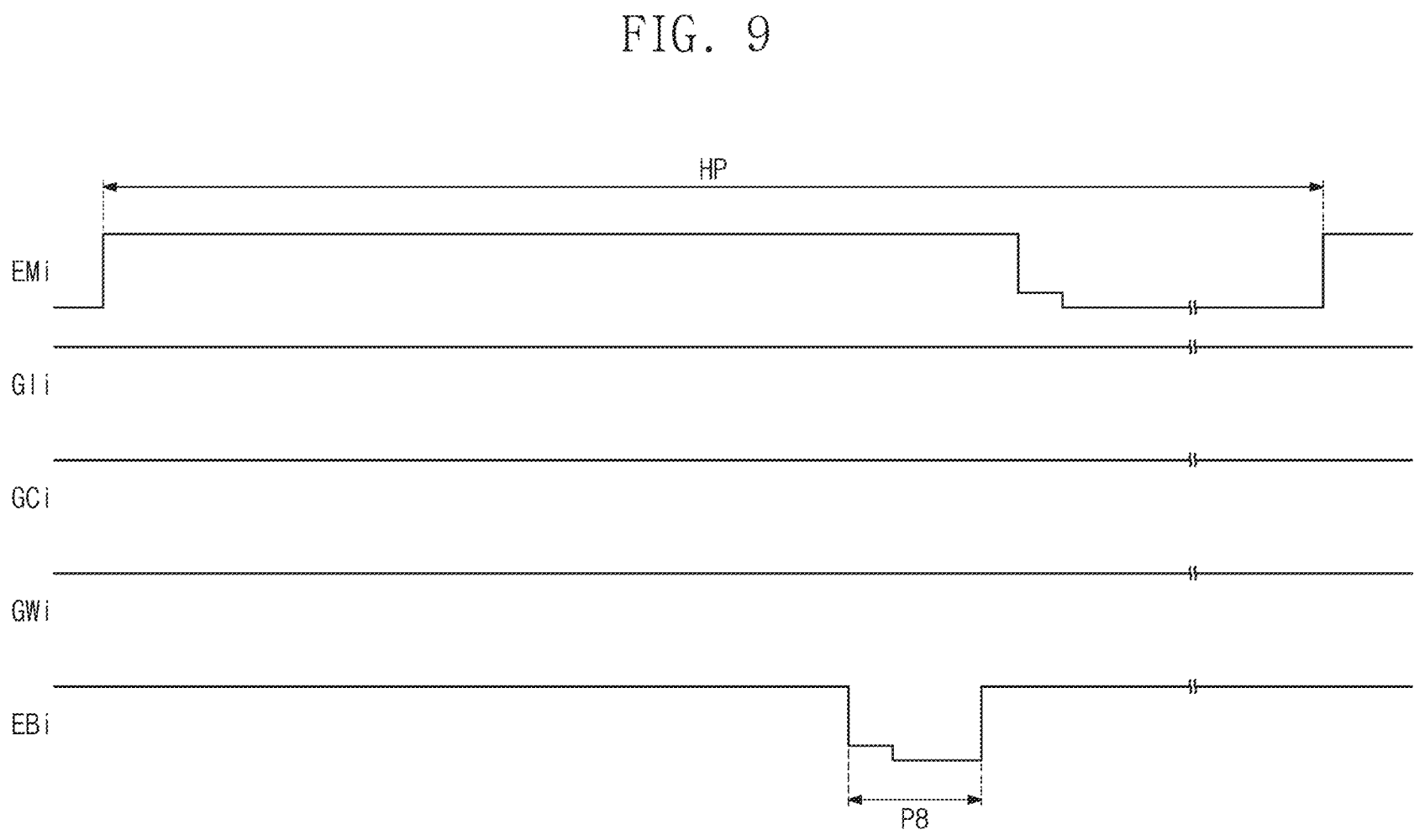

FIGS. 8 and 9 are timing diagrams for describing an operation of a pixel according to an embodiment of the present disclosure, and FIGS. 10A to 10G are diagrams for describing an operation of a pixel according to an embodiment of the present disclosure. In describing FIGS. 10A to 10G, the components which are described with reference to FIG. 5 are marked by the same reference characters, and thus, additional description will be omitted to avoid redundancy.

As illustrated in FIG. 8, the write period WP may include first to seventh periods P1, P2, P3, P4, P5, P6, and P7. As illustrated in FIG. 9, the hold period HP may include an eighth period P8.

Figure 10A:
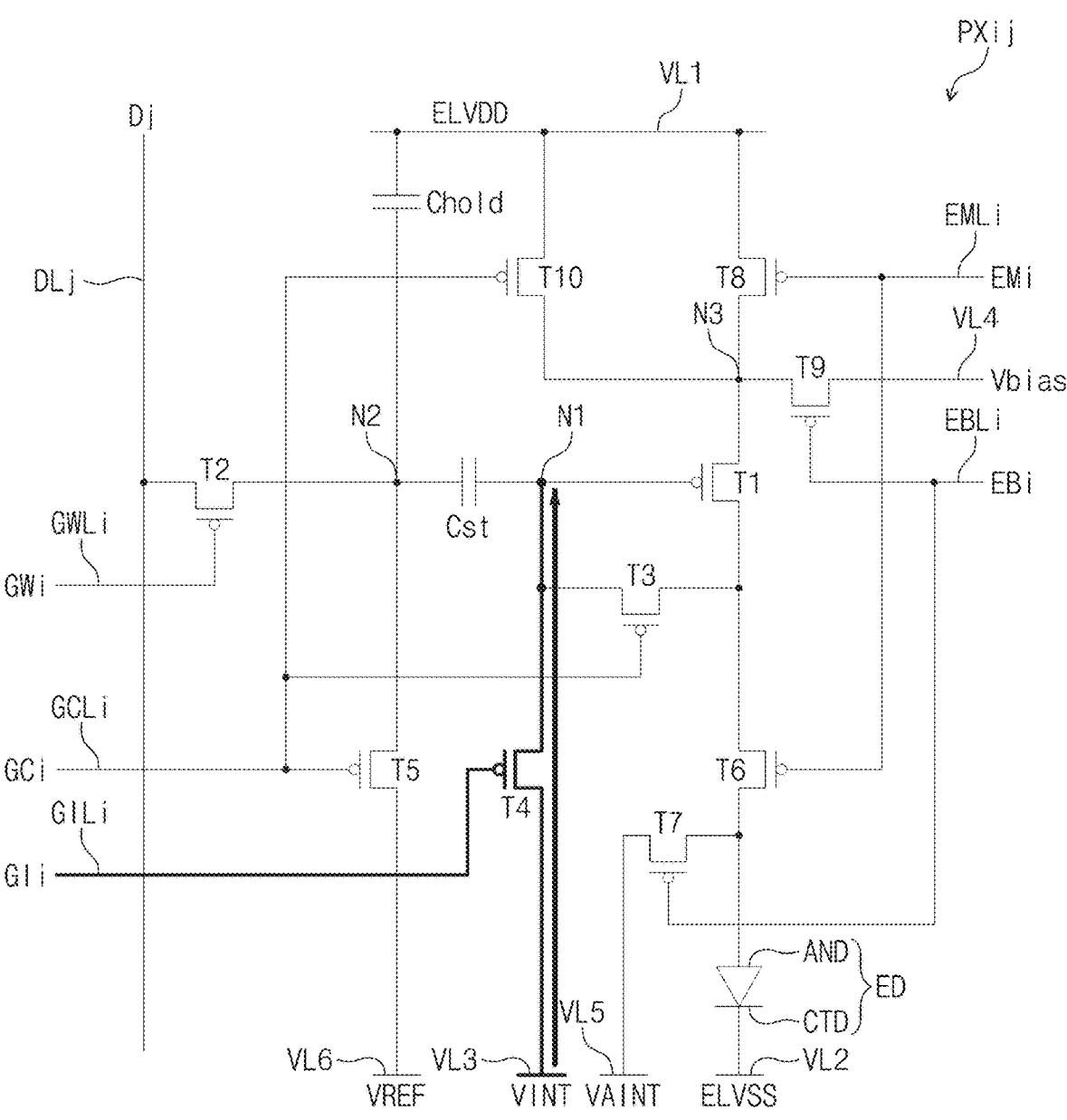
FIGS. 10A to 10G are diagrams for describing an operation of a pixel according to an embodiment of the present disclosure.

Referring to FIGS. 8 and 10A, during the first period P1 of the write period WP, the scan signals GCi, GWi, and EBi and the emission signal EMi are at the inactive level (e.g., the high level), and the scan signal GIi is at the active level (e.g., the low level). The fourth transistor T4 is turned on in response to the scan signal GIi of the active level. Accordingly, during the first period P1, the first initialization voltage VINT may be transferred to the first node N1 through the fourth transistor T4.

The first period P1 may be the first initialization period P1 in which the first node N1, that is, the gate electrode of the first transistor T1 is initialized with the first initialization voltage VINT.

Figure 10B:
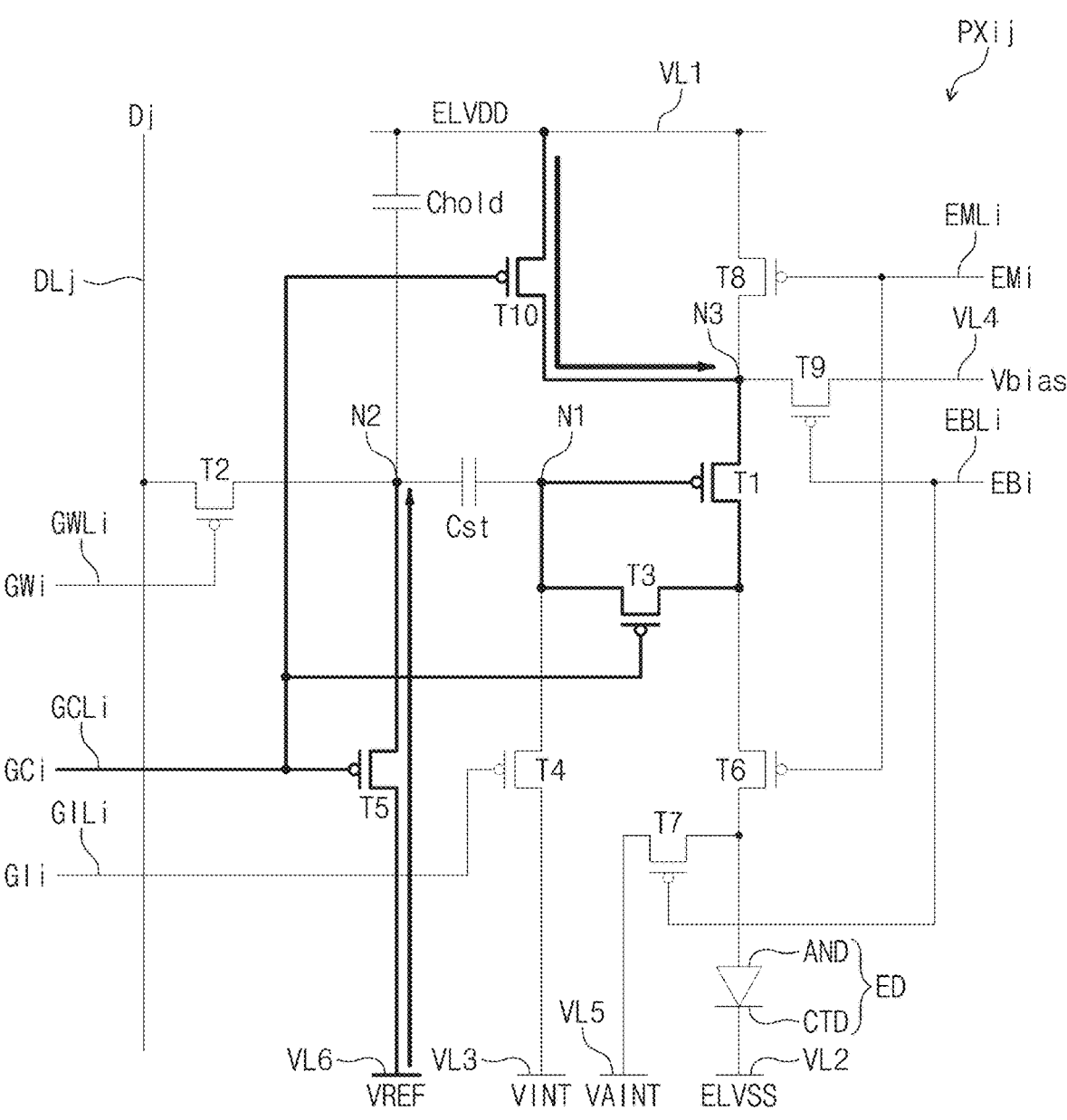

Referring to FIGS. 8 and 10B, during the second period P2 of the write period WP, the scan signals GIi, GWi, and EBi and the emission signal EMi are at the inactive level (e.g., the high level), and the scan signal GCi is at the active level (e.g., the low level). The third transistor T3, the fifth transistor T5, and the tenth transistor T10 are turned on in response to the scan signal GCi of the active level.

As the third transistor T3 and the tenth transistor T10 are turned on, the first driving voltage ELVDD may be transferred to the first node N1 through the tenth transistor T10, the first transistor T1, and the third transistor T3. The gate electrode of the first transistor T1 may be provided with a voltage ("ELVDD-Vth") obtained by subtracting a threshold voltage Vth of the first transistor T1 from the first driving voltage ELVDD.

The second period P2 may refer to the compensation period P2 for compensating for the threshold voltage Vth of the first transistor T1.

As the fifth transistor T5 is turned on, the reference voltage VREF may be transferred to the second node N2 through the fifth transistor T5.

A voltage of the second node N2 may be changed from a voltage (hereinafter referred to as Vdata") of the data signal Dj provided to the data line DLj in a previous frame, to the reference voltage VREF. The variation in the voltage of the second node N2 may be transferred to the first node N1 by the coupling of the first capacitor Cst.

Figure 10C:
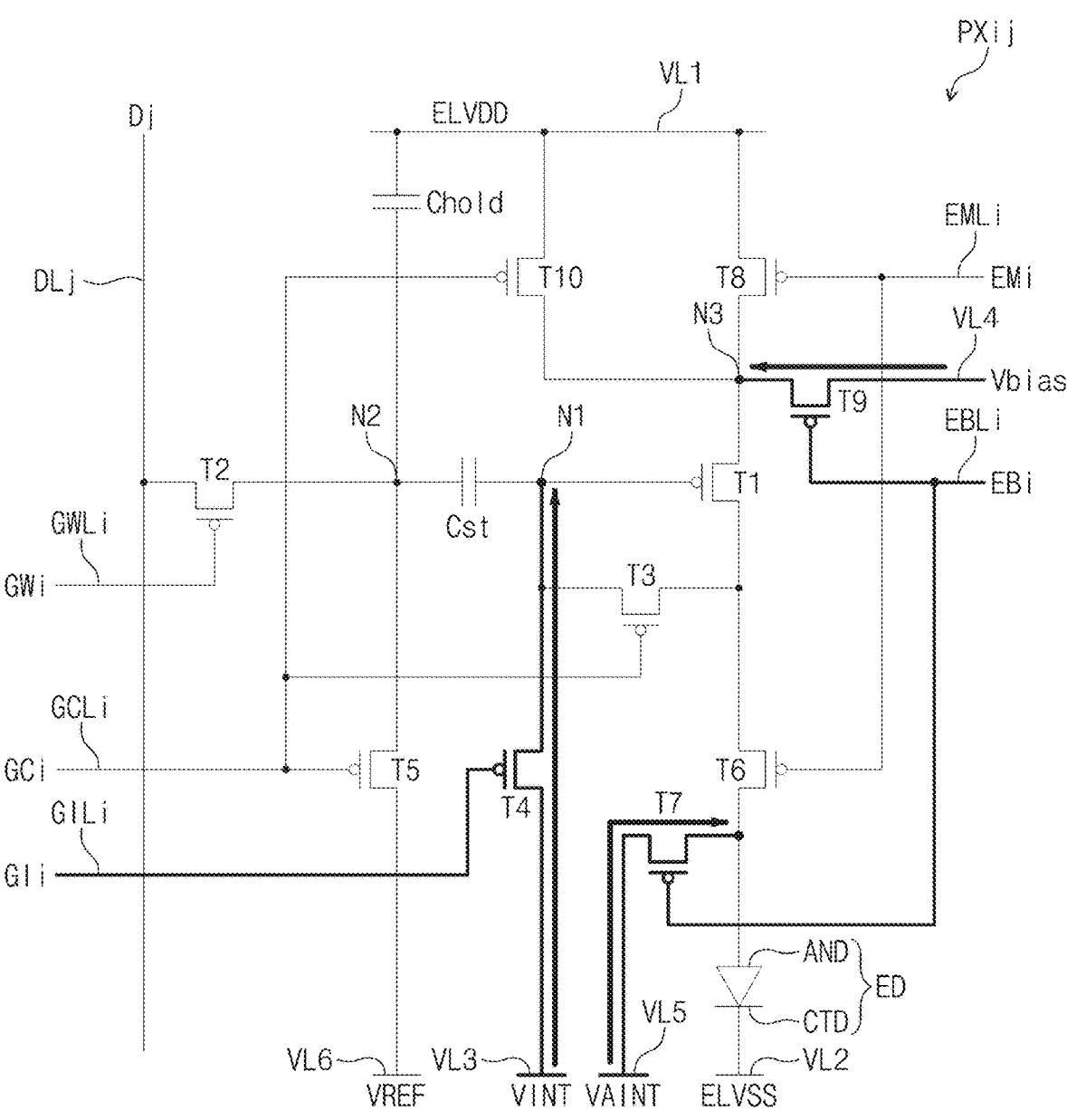

Referring to FIGS. 8 and 10C, during the third period P3 of the write period WP, the scan signals GCi and GWi and the emission signal EMi are at the inactive level (e.g., the high level), and the scan signals GIi and EBi are at the active level (e.g., the low level).

The fourth transistor T4 is turned on in response to the scan signal GIi of the active level. In this case, during the third period P3, the first initialization voltage VINT may be transferred to the first node N1 through the fourth transistor T4.

The seventh transistor T7 is turned on in response to the scan signal EBi of the active level. In this case, during the third period P3, the second initialization voltage VAINT may be transferred to the first electrode AND of the light emitting element ED through the seventh transistor T7.

The ninth transistor T9 is turned on in response to the scan signal EBi of the active level. In this case, during the third period P3, the bias voltage Vbias may be transferred to a third node N3 through the ninth transistor T9.

A width PD2 of the active period of the scan signal EBi may be narrower than a width PD1 of the active period of the scan signal GIi. However, this is an example, and the width PD2 of the active period of the scan signal EBi according to an embodiment of the present disclosure is not limited thereto. For example, the width PD2 of the active period of the scan signal EBi may be equal to the width PD1 of the active period of the scan signal GIi.

The third period P3 may be the second initialization period P3 in which the first node N1, that is, the gate electrode of the first transistor T1 is initialized with the first initialization voltage VINT.

The hysteresis effect due to a characteristic change of the threshold voltage Vth of the first transistor T1 may be minimized by providing the bias voltage Vbias to the first electrode of the first transistor T1.

According to the present disclosure, during the third period P3, the reference voltage VREF may be applied to the second node N2 by the second period P2, and the light emitting element ED may not emit a light due to the emission signal EMi of the inactive level. Also, the bias voltage Vbias may be applied to the third node N3 being the source electrode of the first transistor T1 through the activated scan signal EBi. An environment in which the first transistor T1 performs a desired function based on an operating point may be implemented by the bias voltage Vbias. Accordingly, the pixel PXij with improved reliability and the display device DD (refer to FIG. 1) including the same may be provided.

Figure 10D:
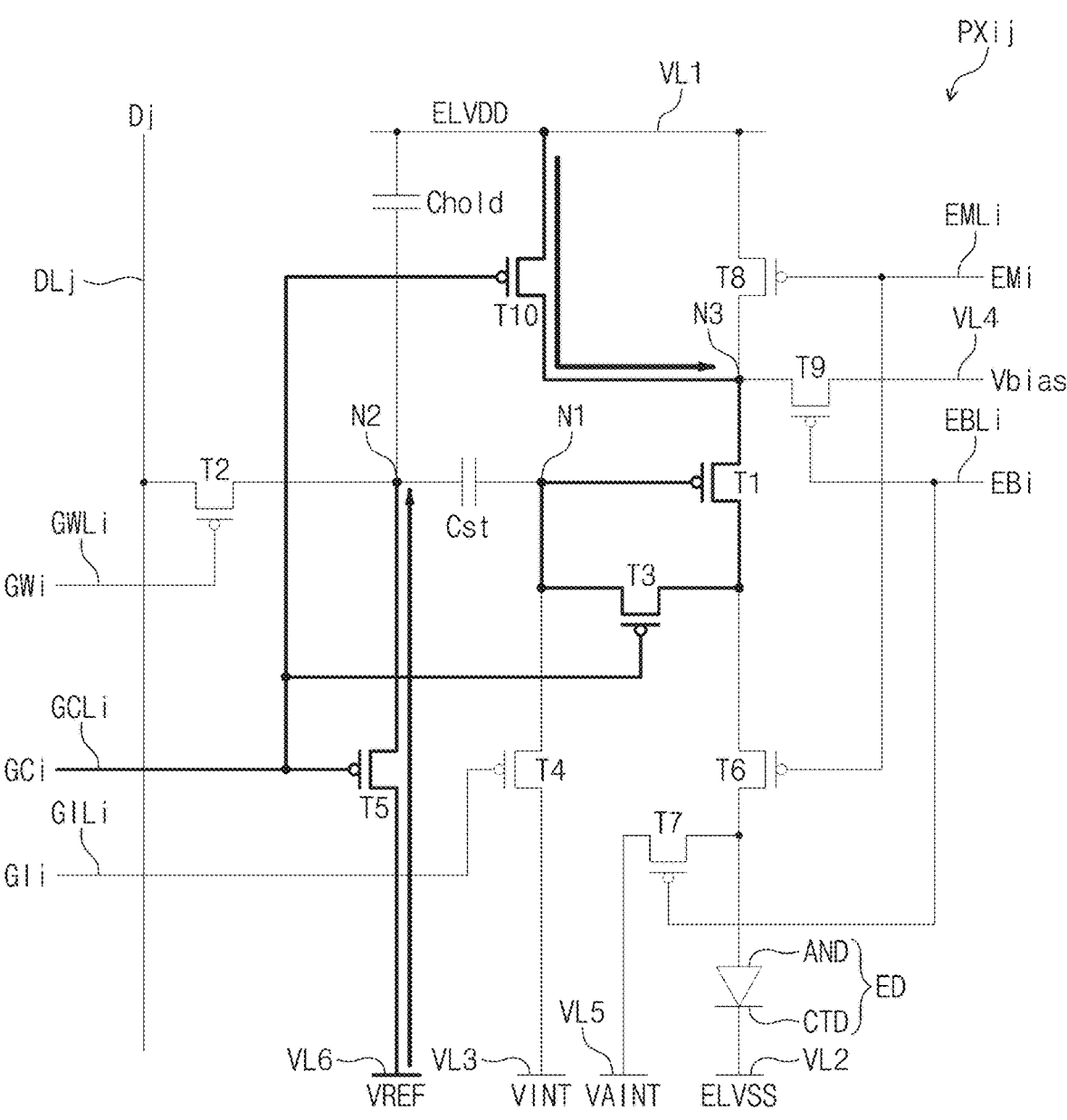

Referring to FIGS. 8 and 10D, during the fourth period P4 of the write period WP, the scan signals GIi, GWi, and EBi and the emission signal EMi are at the inactive level (e.g., the high level), and the scan signal GCi is at the active level (e.g., the low level). The third transistor T3, the fifth transistor T5, and the tenth transistor T10 are turned on in response to the scan signal GCi of the active level.

As the third transistor T3 and the tenth transistor T10 are turned on, the first driving voltage ELVDD may be transferred to the first node N1 through the tenth transistor T10, the first transistor T1, and the third transistor T3.

In this case, the first transistor T1 may operate as a source follower.

The gate electrode of the first transistor T1 may be provided with a voltage ("ELVDD-Vth") obtained by subtracting the threshold voltage Vth of the first transistor T1 from the first driving voltage ELVDD.

According to the present disclosure, as the scan signal EBi is activated in the third period P3 being a previous period, in the fourth period P4, the third node N3 being the source electrode of the first transistor T1 may be not in the floating state but in a state where the bias voltage Vbias is applied to the source electrode of the first transistor T1. In this case, there may be prevented the shift of threshold voltage Vth of the first transistor T1, which is caused when the third node N3 is in the floating state. In the third period P3, the bias voltage Vbias may be applied to the third node N3; in the fourth period P4, a voltage of an accurate level, that is, "ELVDD-Vth" may be applied to the gate electrode of the first transistor T1 as the first transistor T1 operates as a source follower. Accordingly, the pixel PXij with improved reliability and the display device DD (refer to FIG. 1) including the same may be provided.

The fourth period P4 may refer to the compensation period P4 for compensating for the threshold voltage Vth of the first transistor T1.

As the fifth transistor T5 is turned on, the reference voltage VREF may be transferred to the second node N2 through the fifth transistor T5.

The voltage of the second node N2 is the reference voltage VREF in the second period P2, and the reference voltage VREF is again supplied to the second node N2 through the fifth transistor T5 in the fourth period P4. Accordingly, there may be no voltage level change in the voltage of the second node N2.

As described above, the reference voltage VREF may be repeatedly provided to the second node N2 plural times in the second period P2 and the fourth period P4, and thus, the first node N1 may be prevented from being affected by the voltage Vdata of the data signal Dj provided in the previous frame.

An example in which two periods referred to as a "compensation period", that is, the second period P2 and the fourth period P4 are provided is illustrated in FIG. 8, but the number of compensation periods according to an embodiment of the present disclosure is not limited thereto.

During the fourth period P4, the first driving voltage ELVDD may be applied to the third node N3 being the source electrode of the first transistor T1 through the tenth transistor T10. Also, as the third transistor T3 and the fifth transistor T5 are turned on, the threshold voltage Vth may be compensated for.

Figure 10E:
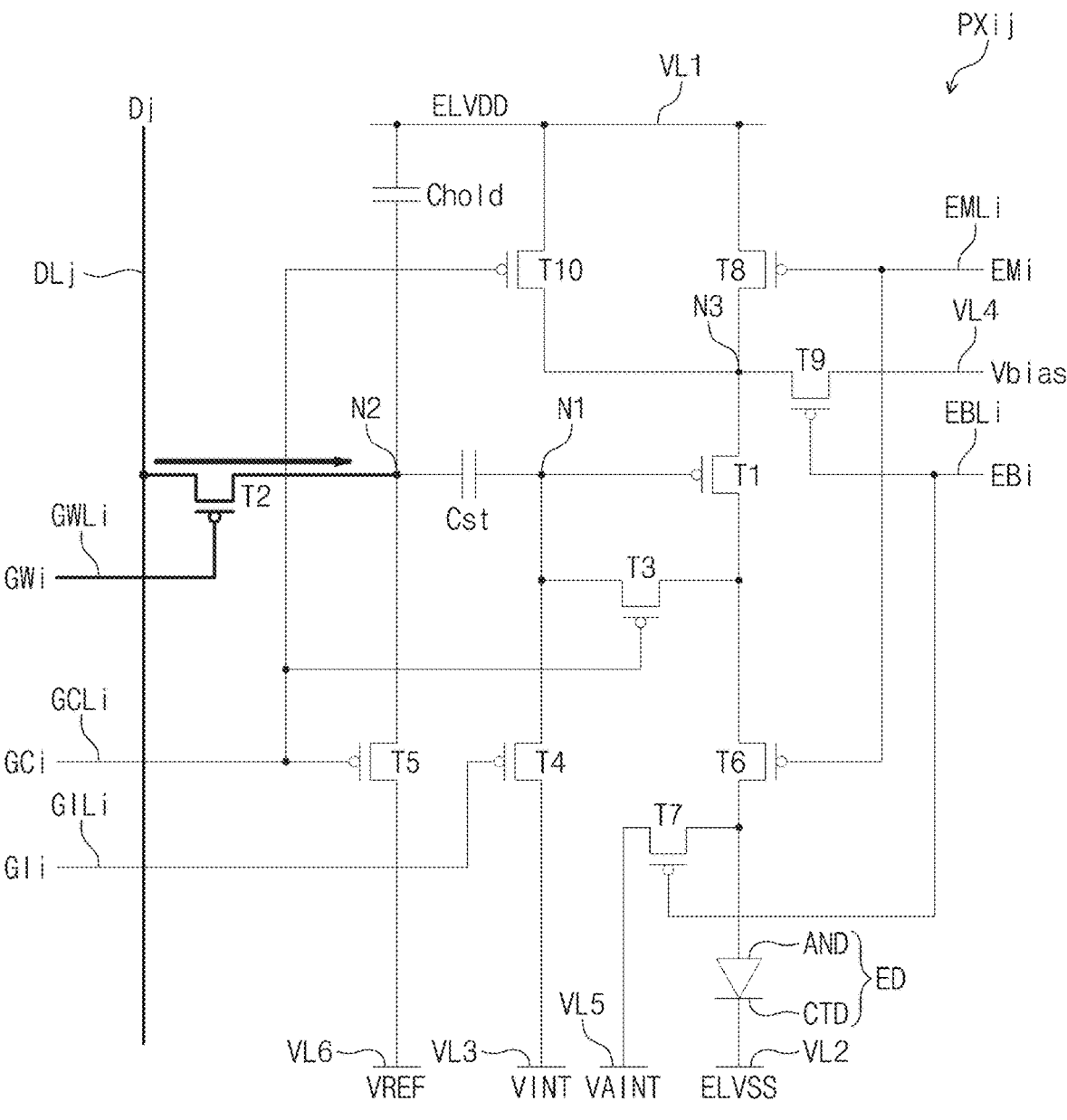

Referring to FIGS. 8 and 10E, during the fifth period P5 of the write period WP, only the scan signal GWi is at the active level. When the second transistor T2 is turned on by the scan signal GWi of the active level, the data signal Dj from the data line DLj may be transferred to the second node N2.

The voltage of the second node N2 is changed from the reference voltage VREF to the voltage Vdata of the data signal Dj. The variation "Vdata-VREF" in the voltage of the second node N2 may be transferred to the first node N1 by the coupling of the first capacitor Cst.

Because the voltage of the first node N1 in the fourth period P4 is "ELVDD-Vth", in the fifth period P5, the voltage of the first node N1, that is, the voltage of the gate electrode of the first transistor T1 is "ELVDD-Vth+(Vdata-VREF)".

The fifth period P5 may refer to the data write period P5 in which the voltage corresponding to the data signal Dj is stored in the first capacitor Cst.

Figure 10F:
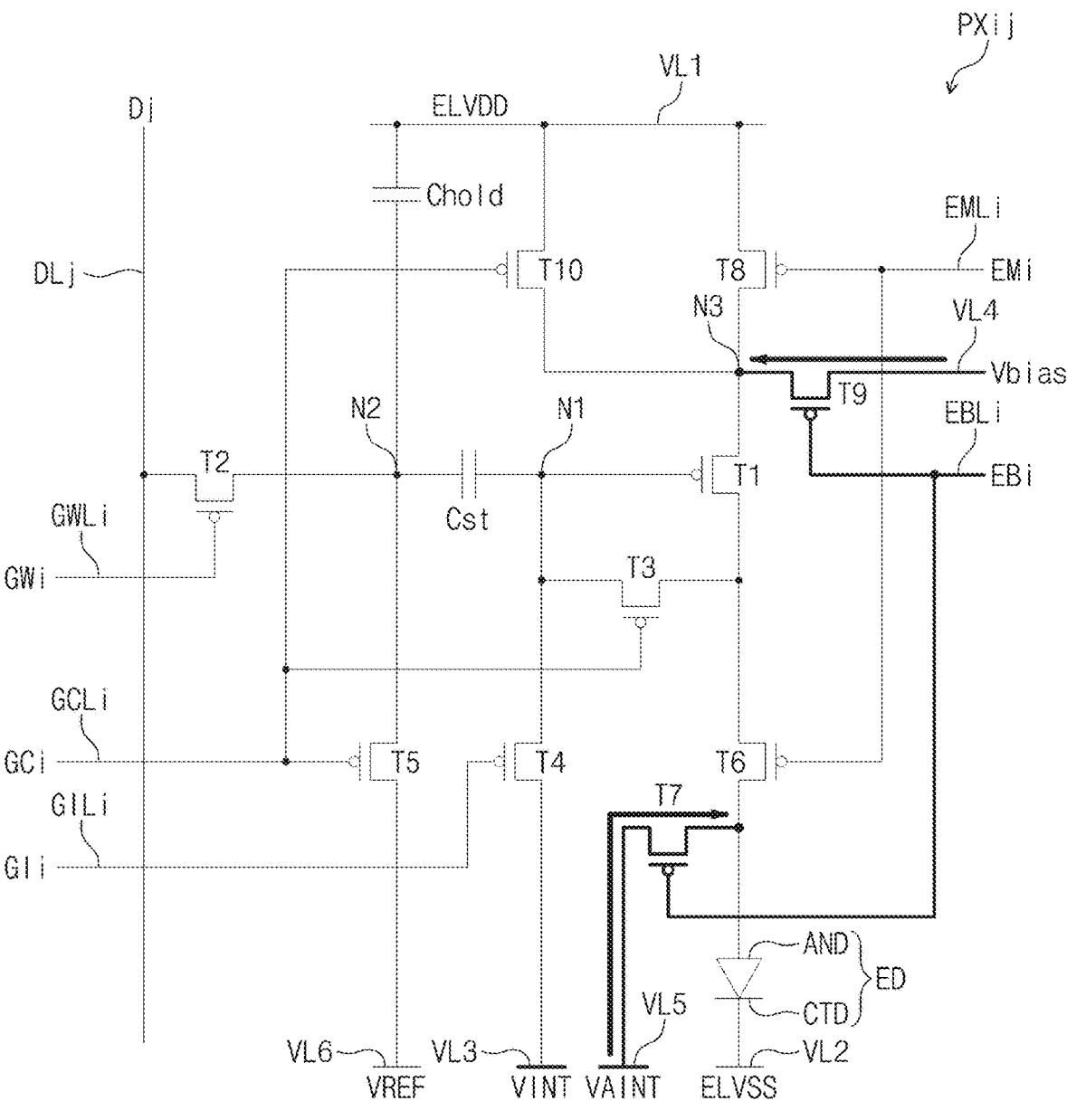

Referring to FIGS. 8 and 10F, during the sixth period P6 of the write period WP, the scan signals GIi, GCi, and GWi and the emission signal EMi are at the inactive level, and the scan signal EBi is at the active level (e.g., the low level).

Each of the seventh transistor T7 and the ninth transistor T9 may be turned on by the scan signal EBi of the active level. The second initialization voltage VAINT is provided to the anode of the light emitting element ED through the seventh transistor T7. The bias voltage Vbias is provided to the first electrode of the first transistor T1 through the ninth transistor T9.

The hysteresis effect due to a characteristic change in the threshold voltage Vth of the first transistor T1 may be minimized by providing the bias voltage Vbias to the first electrode of the first transistor T1.

The sixth period P6 may be an anode initialization and bias period for initializing the anode of the light emitting element ED and the first electrode of the first transistor T1.

Figure 10G:
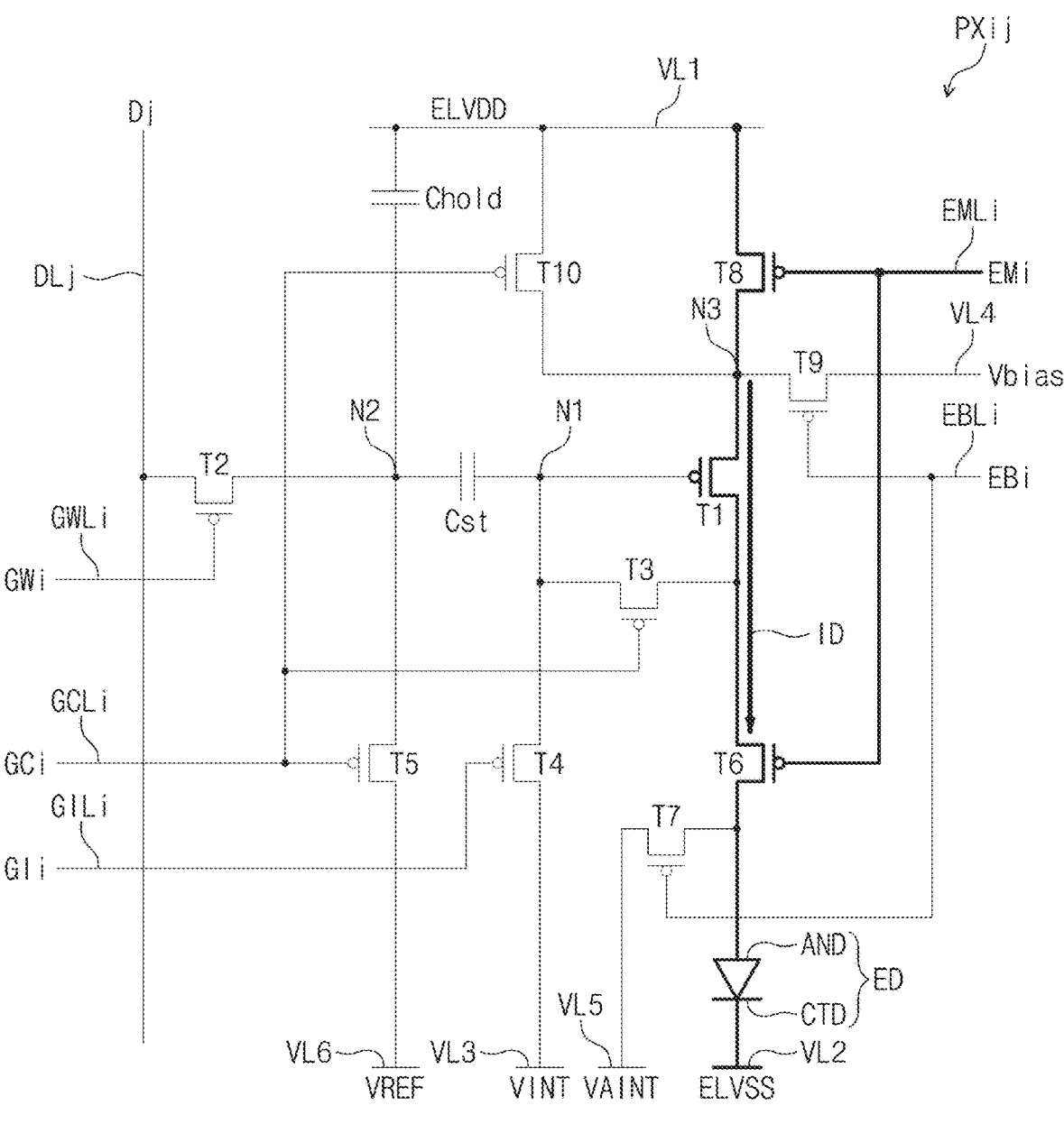

Referring to FIGS. 8 and 10G, during the seventh period P7, all the scan signals GIi, GCi, GWi, and EBi are at the inactive level, and the emission signal EMi is at the active level. Each of the sixth transistor T6 and the eighth transistor T8 may be turned on by the emission signal EMi of the active level.

When the sixth transistor T6 and the eighth transistor T8 are turned on, a current path may be formed from the first voltage line VL1 to the light emitting element ED through the eighth transistor T8, the first transistor T1, and the sixth transistor T6.

In this case, the amount of driving current transferred to the light emitting element ED may be determined depending on a voltage level of the first node N1, that is, a voltage level of the gate electrode of the first transistor T1. In the fifth period P5, the voltage of the gate electrode of the first transistor T1 is "ELVDD-Vth+(Vdata-VREF)".

A current flowing through the first transistor T1 is proportional to "$(Vgs-Vth)^2$" which is the square of a difference between a voltage Vgs corresponding to a voltage difference of the first electrode and the gate electrode of the first transistor T1 and the threshold voltage Vth of the first transistor T1.

Because the voltage of the first electrode of the first transistor T1 is the first driving voltage ELVDD and the voltage of the gate electrode of the first transistor T1 is "ELVDD-Vth+(Vdata-VREF)", the voltage difference Vgs between the first electrode and the gate electrode of the first transistor T1 is "ELVDD-(ELVDD-Vth+(Vdata-VREF))".

Accordingly, the current flowing through the first transistor T1 is proportional to "$((ELVDD-(ELVDD-Vth+(Vdata-VREF)))-Vth)^2$". That is, a driving current ID flowing through the first transistor T1 may be proportional to "$(VREF-Vdata)^2$".

The seventh period P7 may refer to an emission period in which the light emitting element ED emits a light.

According to the present disclosure, in the fourth period P4, a voltage of an accurate level, that is, "ELVDD-Vth" may be applied to the gate electrode of the first transistor T1 as the first transistor T1 operates as a source follower. During the fourth period P4, the influence due to the threshold voltage Vth of the first transistor T1 may be compensated for every pixel PXij. Accordingly, the influence of the threshold voltage Vth of the first transistor T1 may be removed during the seventh period P7, and a current proportional to the voltage Vdata of the data signal Dj may be provided to the light emitting element ED. Accordingly, the pixel PXij with improved display quality and the display device DD (refer to FIG. 1) including the same may be provided.

Referring to FIG. 9, during the eighth period P8 of the hold period HP, the scan signals GIi, GCi, and GWi and the emission signal EMi are at the inactive level, and the scan signal EBi is at the active level (e.g., the low level).

The seventh transistor T7 and the ninth transistor T9 may be turned on by the scan signal EBi of the active level. The initialization voltage VINT is provided to the anode of the light emitting element ED through the seventh transistor T7. The bias voltage Vbias is provided to the first electrode of the first transistor T1 through the ninth transistor T9.

The hysteresis effect due to a characteristic change in the threshold voltage Vth of the first transistor T1 may be minimized by providing the bias voltage Vbias to the first electrode of the first transistor T1.

As illustrated in FIG. 6, when the driving frequency of the display panel DP is the first driving frequency, each of the frames F11 and F12 includes one hold period HP.

As illustrated in FIG. 7, when the driving frequency of the display panel DP is the second driving frequency, the frame F21 includes three hold periods HP.

In comparative examples, unlike the present disclosure, because the data signal Dj is not provided in the hold periods HP, the characteristic of the threshold voltage Vth of the first transistor T1 may change when the number of hold periods HP in one frame increases. However, according to the present disclosure, the hysteresis effect due to a characteristic change in the threshold voltage Vth of the first transistor T1 may be minimized by providing the bias voltage Vbias to the first electrode of the first transistor T1 during the eighth period P8 of the hold period HP. Accordingly, the pixel PXij with improved reliability and the display device DD (refer to FIG. 1) including the same may be provided.

The eighth period P8 may be a hysteresis compensation period for compensating for the hysteresis characteristic of the first transistor T1.

In an embodiment, a width of the fifth period P5 illustrated in FIG. 8 may correspond to one horizontal period. One horizontal period may refer to a time during which the data signals Dj are provided to the pixels PX belonging to one row of the display panel DP (refer to FIG. 2). A width of each of the second period P2 and the fourth period P4 illustrated in FIG. 8, that is, the first compensation period and the second compensation period may correspond to a time longer than one horizontal period. Because each of the second period P2 and the fourth period P4 is longer than one horizontal period, it is possible to sufficiently secure a time necessary to compensate for the threshold voltage Vth of the first transistor T1 even though the driving frequency of the display device DD becomes higher. Accordingly, the pixel PXij may stably operate at a high driving frequency.

The pixel PXij includes the ten transistors T1 to T10 and the two capacitors Cst and Chold. The circuit area of the pixel PXij may be minimized by minimizing the number of transistors in the pixel PXij. The pixel PXij includes the first to sixth voltage lines VL1, VL2, VL3, VL4, VL5, VL6 for receiving the first driving voltage ELVDD, the second driving voltage ELVSS, the first initialization voltage VINT, the second initialization voltage VAINT, the reference voltage VREF, and the bias voltage Vbias. Besides, the pixel PXij operates in response to the four scan signals GIi, GCi, GWi, and EBi and the one emission signal EMi. The circuit area of the pixel PXij may be reduced by minimizing the number of voltage lines connected to the pixel PXij, the number of scan lines connected to the pixel PXij, and the number of emission lines connected to the pixel PXij.

According to the present disclosure, compared to the case where a first emission signal and a second emission signal different from each other are respectively provided to the sixth transistor T6 and the eighth transistor T8, the number of lines GIL1 to GILn, GCL1 to GCLn, GWL1 to GWLn, EBL1 to EBLn, and EML1 to EMLn (refer to FIG. 2) extending in the first direction DR1 (refer to FIG. 2) may be reduced. The area of the pixel circuit of each of the plurality of pixels PX may be reduced. That is, the number of pixels PX disposed in the same area may be increased. Accordingly, the pixels per inch (PPI) of the display device DD (refer to FIG. 1) may be improved.

Also, the sixth transistor T6 and the eighth transistor T8 included in one pixel PX may be connected to the same emission line (e.g., one of EML1 to EMLn of FIG. 2). Compared to the case where a first emission signal and a second emission signal different from each other are respectively provided to the sixth transistor T6 and the eighth transistor T8, the number of emission driving circuits 310 and 410 (refer to FIGS. 3 and 4) may be reduced. Accordingly, the area of the non-display area NDA may be reduced.

Figure 11:
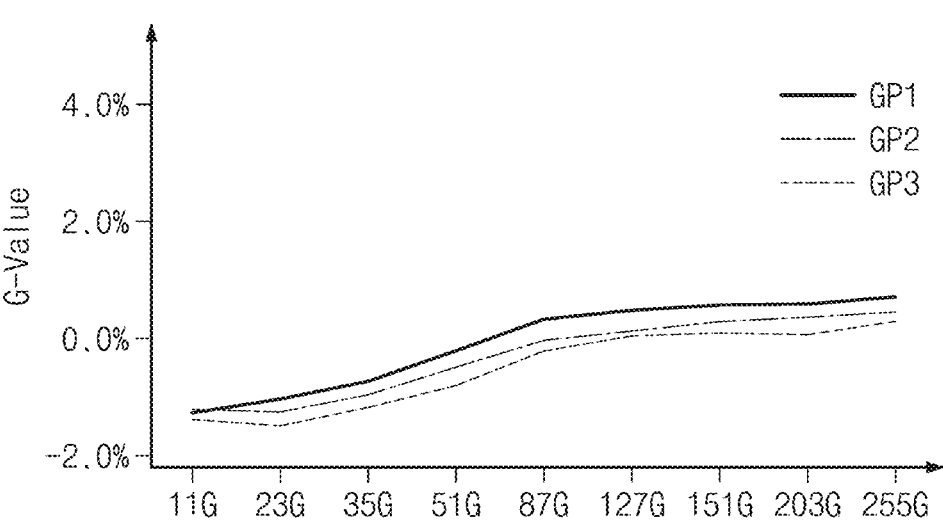
FIG. 11 is a graph illustrating a relationship between G-values and gray levels, according to an embodiment of the present disclosure.

FIG. 11 is a graph illustrating a relationship between G-Values and gray levels, according to an embodiment of the present disclosure.

In FIG. 11, the horizontal axis represents a gray level of a grayscale image displayed in the display panel DP (refer to FIG. 2), and the vertical axis represents a G-value.

The G-value may be obtained by quantitatively measuring a luminance difference of the same image according to the driving frequency. The G-value may be defined by Equation 1 below.

$$G-\text{Value} = (LUM(HIGHFREQ) - LUM(LOWFREQ))/ \quad \text{[Equation 1]}$$
$$LUM(HIGHFREQ)$$

Referring to Equation 1 above, the G-Value may represent a G-value, the LUM(HIGHFREQ) may represent the luminance of the display panel DP (refer to FIG. 2) which is driven at the first driving frequency among variable driving frequencies, and the LUM(LOWFREQ) may represent the luminance of the display panel DP (refer to FIG. 2) which is driven at the second driving frequency lower than the first frequency from among the variable driving frequencies. The unit of the G-value may be %.

Referring to FIG. 11, a first graph GP1 shows a G-value according to a gray level when the first driving frequency is 45 Hertz (Hz), a second graph GP2 shows a G-value according to a gray level when the first driving frequency is 60 Hz, and a third graph GP2 shows a G-value according to a gray level when the first driving frequency is 90 Hz.

TABLE 1

|  | 11G | 23G | 35G | 51G | 87G | 127G | 151G | 203G | 255G |
|---|---|---|---|---|---|---|---|---|---|
| CE1 | 0.35% | 1.23% | 1.52% | 1.61% | 1.59% | 1.39% | 1.28% | 1.13% | 1.11% |
| CE2 | −1.20% | 0.82% | 1.16% | 1.31% | 1.28% | 1.19% | 1.05% | 0.92% | 0.93% |
| CE3 | −3.60% | −0.47% | 0.15% | 0.44% | 0.58% | 0.56% | 0.53% | 0.46% | 0.55% |

TABLE 1-continued

|      | 11G     | 23G     | 35G     | 51G     | 87G     | 127G   | 151G   | 203G   | 255G   |
|------|---------|---------|---------|---------|---------|--------|--------|--------|--------|
| GP1  | −1.06%  | −0.85%  | −0.56%  | −0.05%  | 0.49%   | 0.65%  | 0.73%  | 0.74%  | 0.87%  |
| GP2  | −1.04%  | −1.09%  | −0.79%  | −0.32%  | 0.15%   | 0.30%  | 0.46%  | 0.53%  | 0.61%  |
| GP3  | −1.20%  | −1.32%  | −1.00%  | −0.63%  | −0.03%  | 0.22%  | 0.26%  | 0.23%  | 0.46%  |

Table 1 shows values which the first to third graphs GP1, GP2, and GP3 have for each gray level. Referring to Table 1 and FIGS. 5, 8, and 11, as the scan signal EBi is activated during the third period P3, the bias voltage Vbias may be applied to the third node N3 which is the source electrode of the first transistor T1.

In Table 1, comparative example 1 CE1 shows G-values according to gray levels when the first driving frequency is 45 Hz, comparative example 2 CE2 shows G-values according to gray levels when the first driving frequency is 60 Hz, and comparative example 3 CE3 shows G-values according to gray levels when the first driving frequency is 90 Hz.

Unlike the present disclosure, when the bias voltage Vbias is not applied to the third node N3, the threshold voltage Vth may be shifted due to the floating state of the third node N3. For this reason, referring to the comparative examples of Table 1, at 11G belonging to a low grayscale zone, a G-value deviation may occur as much as a maximum of 3.25% for each driving frequency. For example, assuming that the G-value deviation is relatively great, the luminance difference may be visually perceived by the user when the driving frequency is variable and may be perceived as a flicker. However, according to the present disclosure, the bias voltage Vbias may be applied to the third node N3 during the third period PD3, and thus, the threshold voltage shift may be prevented in the fourth period PD4. Referring to the first to third graphs GP1, GP2, and GP3 of Table 1, at 11G belonging to a low grayscale zone, a G-value deviation may occur as much as a maximum of 0.16% for each driving frequency. That is, the G-value deviation for each driving frequency may be improved. Accordingly, the display device DD (refer to FIG. 2) with improved display quality may be provided.

TABLE 2

|                 | Comparative Example | Present Disclosure |
|-----------------|---------------------|--------------------|
| 1               | 0.0129              | 0.0085             |
| 2               | 0.0139              | 0.0090             |
| 3               | 0.0131              | 0.0120             |
| 4               | 0.0135              | 0.0104             |
| 5               | 0.0137              | 0.0101             |
| Average value   | 0.0134              | 0.0100             |

Table 2 shows an F-value of the display panel DP (refer to FIG. 2). Table 2 shows an average value obtained from five measurement results. The F-value may be defined by Equation 2 below.

$$F\text{-Value} = (LUM(HIGHFREQ, 255G) - LUM(LOWFREQ,$$ [Equation 2]

$$255G))/(HIGHFREQ - LOWFREQ)$$

Referring to Equation 2 above, the F-Value may represent an F-value, the LUM(HIGHFREQ,255G) may represent the luminance corresponding to the gray level of 255G when the display panel DP (refer to FIG. 2) is driven at the first frequency among the variable driving frequencies, the LUM (LOWFREQ,255G) may represent the luminance corresponding to the gray level of 255G when the display panel DP (refer to FIG. 2) is driven at the second driving frequency lower than the first driving frequency from among the variable driving frequencies, and the (HIGHFREQ–LOWFREQ) may represent a value obtained by subtracting the second driving frequency from the first driving frequency.

In Table 2, the comparative example is associated with the case where the scan signal EBi is not provided in the third period P3, and the present disclosure is associated with the pixel PXij to which the write period WP of FIG. 8 where the scan signal EBi is provided in the third period P3 is applied.

According to the present disclosure, the phenomenon that the threshold voltage Vth is shifted in the fourth period P4 may be prevented by the third period P3. In this case, the F-value of the display panel DP (refer to FIG. 2) may have an average value of 0.0100. Compare to the comparative example where the bias voltage Vbias is not applied to the third node N3, the F-value may be improved as much as about 30%. Accordingly, the display device DD (refer to FIG. 2) with improved display quality may be provided.

Figure 12:
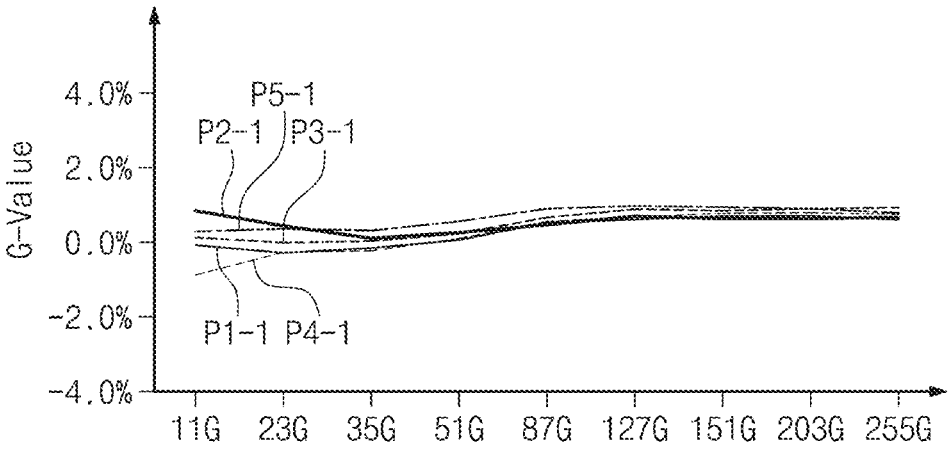
FIG. 12 is a graph illustrating a relationship between G-values and gray levels, according to an embodiment of the present disclosure.

FIG. 12 is a graph illustrating a relationship between G-Values and gray levels, according to an embodiment of the present disclosure. In the description of FIG. 12, the horizontal axis represents a gray level of a grayscale image displayed in the display panel DP (refer to FIG. 2), and the vertical axis represents a G-value.

Referring to FIG. 12, first to fifth graphs P1-1, P2-1, P3-1, P4-1, and P5-1 are respectively associated with five display panels DP (refer to FIG. 2) and show G-values according to gray levels when the first driving frequency is 360 Hz and the second driving frequency is 45 Hz.

TABLE 3

|       | 11G    | 23G     | 35G     | 51G    | 87G    | 127G   | 151G   | 203G   | 255G   |
|-------|--------|---------|---------|--------|--------|--------|--------|--------|--------|
| CE1   | 0.19%  | 1.54%   | 1.63%   | 1.83%  | 1.64%  | 1.46%  | 1.48%  | 1.20%  | 1.01%  |
| CE2   | 0.01%  | 1.79%   | 2.09%   | 1.89%  | 1.84%  | 1.62%  | 1.48%  | 1.26%  | 1.08%  |
| CE3   | 0.02%  | 1.57%   | 1.86%   | 1.87%  | 1.82%  | 1.64%  | 1.52%  | 1.20%  | 1.02%  |
| CE4   | 0.21%  | 1.54%   | 1.83%   | 1.62%  | 1.62%  | 1.48%  | 1.30%  | 1.15%  | 1.06%  |
| CE5   | 0.25%  | 1.42%   | 1.60%   | 1.67%  | 1.58%  | 1.37%  | 1.29%  | 1.10%  | 1.07%  |
| P1-1  | 0.01%  | −0.25%  | −0.13%  | 0.12%  | 0.57%  | 0.67%  | 0.69%  | 0.74%  | 0.68%  |
| P2-1  | 0.84%  | 0.47%   | 0.14%   | 0.28%  | 0.58%  | 0.72%  | 0.70%  | 0.67%  | 0.71%  |

TABLE 3-continued

|  | 11G | 23G | 35G | 51G | 87G | 127G | 151G | 203G | 255G |
|---|---|---|---|---|---|---|---|---|---|
| P3-1 | 0.18% | 0.04% | 0.08% | 0.29% | 0.73% | 0.90% | 0.86% | 0.93% | 0.94% |
| P4-1 | −0.79% | −0.20% | −0.18% | 0.15% | 0.59% | 0.72% | 0.81% | 0.80% | 0.82% |
| P5-1 | 0.34% | 0.40% | 0.35% | 0.59% | 0.94% | 0.99% | 0.98% | 0.93% | 0.80% |

Table 3 shows values which the first to fifth graphs P1-1, P2-1, P3-1, P4-1, and P5-1 have for each gray level. Referring to Table 3 and FIGS. 5, 8, and 12, as the scan signal EBi is activated during the third period P3, the bias voltage Vbias may be applied to the third node N3 which is the source electrode of the first transistor T1.

In Table 3, comparative example 1 CE1 to comparative example 5 CE5 show G-values when the first driving frequency is 360 Hz and the second driving frequency is 45 Hz.

Unlike the present disclosure, when the bias voltage Vbias is not applied to the third node N3, the threshold voltage Vth may be shifted due to the floating state of the third node N3. For this reason, at each gray level, the maximum value of the G-value deviation for each driving frequency may be appropriately 2%. However, according to the present disclosure, the phenomenon that the threshold voltage Vth is shifted in the fourth period P4 may be prevented by the third period P3. At each gray level, the maximum value of the G-value deviation for each driving frequency may be appropriately 1%. That is, the G-value deviation for each driving frequency may be improved. Accordingly, the display device DD (refer to FIG. 2) with improved display quality may be provided.

Figure 13:
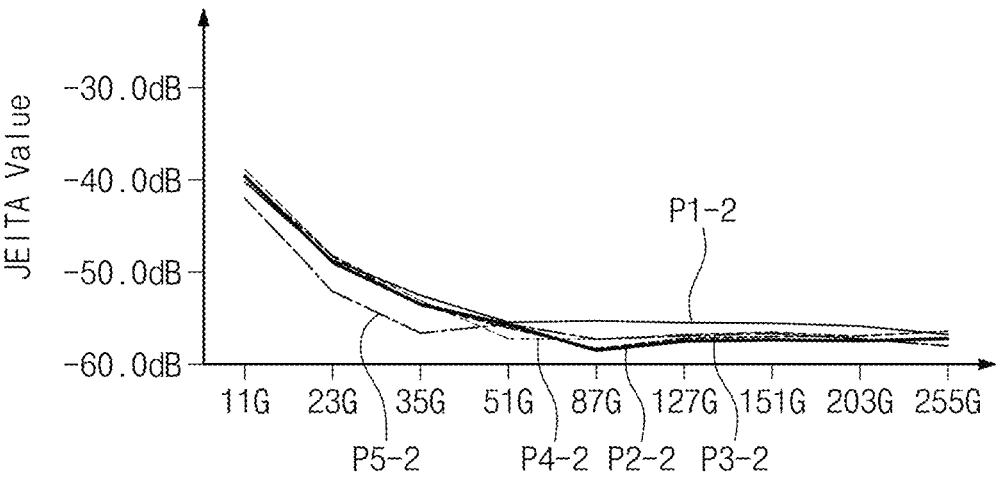
FIG. 13 is a graph illustrating a relationship between JEITA value and gray levels, according to an embodiment of the present disclosure.

FIG. 13 is a graph illustrating a relationship between JEITA value and gray levels, according to an embodiment of the present disclosure.

Referring to FIG. 13, first to fifth graphs P1-2, P2-2, P3-2, P4-2, and P5-2 are respectively associated with five display panels DP (refer to FIG. 2) and show JEITA values according to gray levels.

A flicker level may be measured using the JEITA flicker measurement method for the purpose of quantitatively evaluating a flicker level of the display device DD (refer to FIG. 2). The JEITA value may be a quantitative value of a flicker which the Japan Electronics and Information Technology Industries Association defines. The unit of the JEITA value may be dB (decibel).

Referring to Table 4 and FIGS. 5, 8, and 13, as the scan signal EBi is activated during the third period P3, the bias voltage Vbias may be applied to the third node N3 which is the source electrode of the first transistor T1.

Unlike the present disclosure, in the display panel DP (refer to FIG. 2) operating in the variable frequency mode, the luminance of the display panel DP (refer to FIG. 2) may vary depending on driving frequencies; in this case, the flicker may be caused when the driving frequency of the display panel DP (refer to FIG. 2) is changed. However, according to the present disclosure, the phenomenon that the threshold voltage Vth is shifted in the fourth period P4 may be prevented by the third period P3. In this case, the JEITA value may be improved as much as about −4 dB when a 400 nit reference gray level is 127G. A decrease in the JEITA value may mean that the flicker is improved. Accordingly, the display device DD (refer to FIG. 2) with improved display quality may be provided.

Figure 14:
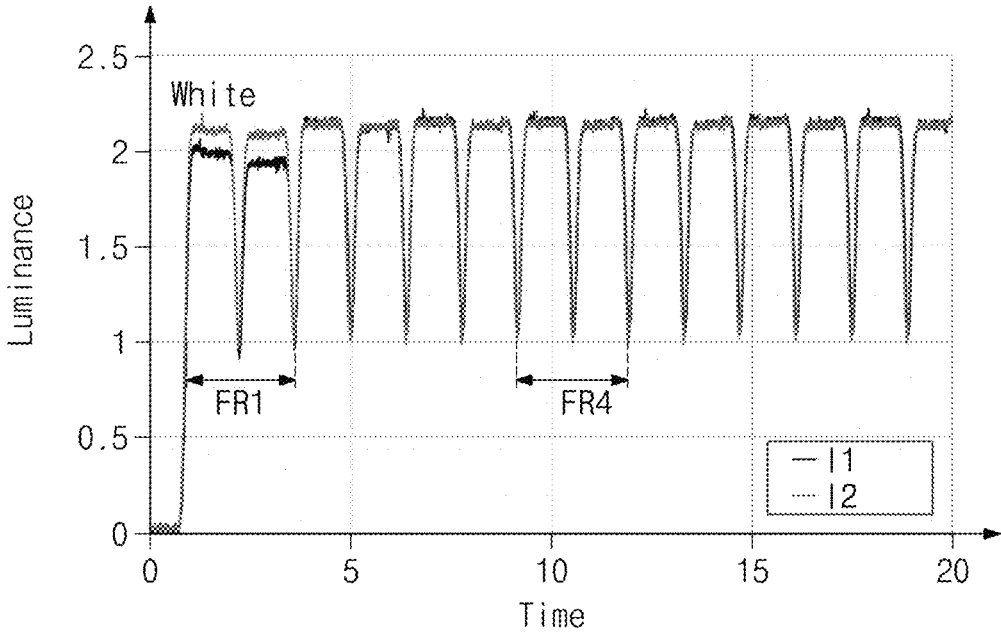
FIG. 14 is a graph illustrating luminance for each time, according to an embodiment of the present disclosure.

FIG. 14 is a graph illustrating luminance for each time, according to an embodiment of the present disclosure.

In FIG. 14, the horizontal axis may represent a time and may represent frames FR1 and FR4 which are driven by the display panel DP (refer to FIG. 2). The first frame FR1 and the fourth frame FR4 are illustrated in FIG. 14 as an example. The vertical axis may represent luminance of the display panel DP (refer to FIG. 2).

Referring to FIG. 14, a first graph I1 shows luminance measured when a display panel is driven while changing from a black screen to a white screen for each display frame, in the case of a comparative example where the bias voltage Vbias is not applied to the third node N3 during the third period P3.

A second graph I2 shows luminance measured when the display panel DP (refer to FIG. 2) is driven while changing from a black screen to a white screen for each display frame, in the configuration of the present disclosure, in which the bias voltage Vbias is applied to the third node N3 during the third period P3.

TABLE 4

|  | 11G | 23G | 35G | 51G | 87G | 127G | 151G | 203G | 255G |
|---|---|---|---|---|---|---|---|---|---|
| CE1 | −37.2 dB | −44.4 dB | −47.4 dB | −48.0 dB | −51.0 dB | −52.1 dB | −52.7 dB | −53.9 dB | −55.7 dB |
| CE2 | −38.2 dB | −46.1 dB | −48.9 dB | −50.1 dB | −51.9 dB | −53.1 dB | −53.7 dB | −54.4 dB | −56.1 dB |
| CE3 | −39.0 dB | −46.1 dB | −48.8 dB | −50.4 dB | −52.2 dB | −53.3 dB | −53.9 dB | −54.5 dB | −56.2 dB |
| CE4 | −38.7 dB | −46.2 dB | −49.0 dB | −50.3 dB | −52.3 dB | −53.6 dB | −54.3 dB | −54.8 dB | −56.4 dB |
| CE5 | −38.8 dB | −46.6 dB | −49.7 dB | −51.6 dB | −53.1 dB | −54.4 dB | −55.0 dB | −56.4 dB | −57.0 dB |
| P1-2 | −40.2 dB | −49.0 dB | −52.2 dB | −55.5 dB | −55.3 dB | −55.5 dB | −55.6 dB | −55.9 dB | −56.8 dB |
| P2-2 | −39.6 dB | −49.0 dB | −53.7 dB | −55.8 dB | −58.4 dB | −57.5 dB | −57.5 dB | −57.6 dB | −57.3 dB |
| P3-2 | −39.1 dB | −48.5 dB | −53.7 dB | −56.2 dB | −58.1 dB | −57.1 dB | −57.1 dB | −56.8 dB | −56.5 dB |
| P4-2 | −39.1 dB | −48.4 dB | −53.1 dB | −57.2 dB | −57.3 dB | −56.7 dB | −56.6 dB | −57.0 dB | −56.5 dB |
| P5-2 | −42.0 dB | −52.2 dB | −56.6 dB | −55.8 dB | −57.4 dB | −57.0 dB | −56.6 dB | −57.2 dB | −58.0 dB |

Table 4 shows JEITA values which the first to fifth graphs P1-2, P2-2, P3-2, P4-2, and P5-2 have for each gray level. In Table 4, comparative example 1 CE1 to comparative example 5 CE5 show JEITA values according to gray levels when the first driving frequency is 360 Hz and the second driving frequency is 45 Hz.

TABLE 5

|  | Comparative Example | Present Disclosure |
|---|---|---|
| 1 | 90.9% | 98.1% |
| 2 | 89.7% | 97.5% |

TABLE 5-continued

|  | Comparative Example | Present Disclosure |
|---|---|---|
| 3 | 90.7% | 98.0% |
| 4 | 90.3% | 97.7% |
| 5 | 88.9% | 97.4% |
| 6 | 90.9% | 97.7% |
| 7 | 90.4% | 97.6% |
| 8 | 89.9% | 97.5% |
| 9 | 91.0% | 98.0% |
| 10 | 91.2% | 97.9% |
| Average value | 90.4% | 97.7% |

Table 5 shows a ratio of luminance of a white screen in the first frame FR1 to luminance of a white screen in the fourth frame FR4. The ratio may be referred to as "step efficiency". Table 5 shows an average value obtained from ten measurement results. In Table 5, the comparative example is associated with the case where the scan signal EBi is not provided in the third period P3, and the present disclosure is associated with the pixel PXij to which the write period WP of FIG. 8 where the scan signal EBi is provided in the third period P3 is applied.

According to the present disclosure, the phenomenon that the threshold voltage Vth is shifted in the fourth period P4 may be prevented by the third period P3. In this case, the step efficiency of the display panel DP (refer to FIG. 2) may have an average value of 97.7%. Compared to the comparative example where the bias voltage Vbias is not applied to the third node N3, the step efficiency may be improved. Accordingly, the display device DD (refer to FIG. 2) with improved display quality may be provided.

Figure 15:
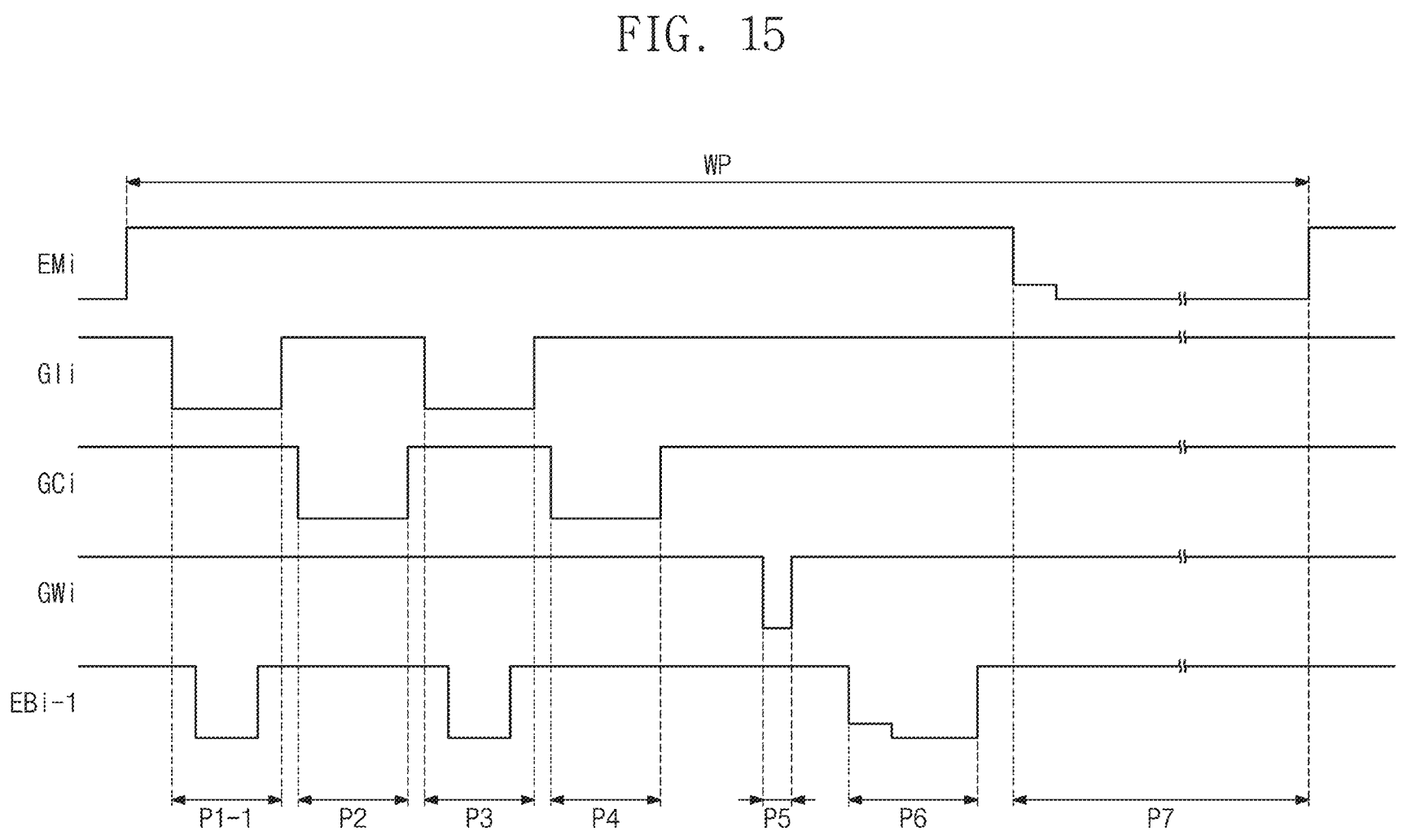

FIG. 15 is a timing diagram for describing an operation of a pixel according to an embodiment of the present disclosure. In the description of FIG. 15, the signals and periods that are described with reference to FIG. 8 are marked by the same reference characters, and thus, additional description will be omitted to avoid redundancy.

Referring to FIGS. 5 and 15, the write period WP may include first to seventh periods P1-1, P2, P3, P4, P5, P6, and P7.

During the first period P1-1 of the write period WP, the scan signals GCi and GWi and the emission signal EMi are at the inactive level (e.g., the high level), and scan signals GIi and EBi-1 are at the active level (e.g., the low level).

The seventh transistor T7 is turned on in response to the scan signal EBi-1 of the active level. In this case, during the first period P1-1, the second initialization voltage VAINT may be transferred to the first electrode AND of the light emitting element ED through the seventh transistor T7.

The operation in the first period P1-1 may be substantially identical to the operation in the third period P3. The first period P1-1 and the third period P3 may be referred to as an "initialization period". The second period P2 and the fourth period P4 may be referred to as a "compensation period".

That is, the initialization periods P1-1 and P3 and the compensation periods P2 and P4 may be alternately repeated plural times.

According to an embodiment of the present disclosure, the bias voltage Vbias may have a first voltage level during the first period P1-1 and may have a second voltage level higher than the first voltage level during the third period P3. However, this is only an example, and the bias voltage Vbias may have the same voltage level in the first period P1-1 and the third period P3 according to an embodiment of the present disclosure.

According to the present disclosure, as the scan signal EBi-1 is activated in the first period P1-1 and the third period P3 being previous periods, in the fourth period P4, the third node N3 being the source electrode of the first transistor T1 may be not in the floating state but in a state where the bias voltage Vbias is applied to the third node N3. In this case, there may be prevented the shift of threshold voltage Vth of the first transistor T1, which is caused when the third node N3 is in the floating state. The bias voltage Vbias may be applied to the third node N3 in the first period P1-1 and the third period P3, and as the first transistor T1 operates as a source follower in the fourth period P4, a voltage of an accurate level, that is, "ELVDD−Vth" may be applied to the gate electrode of the first transistor T1. Accordingly, the pixel PXij with improved reliability and the display device DD (refer to FIG. 1) including the same may be provided.

Figure 16:
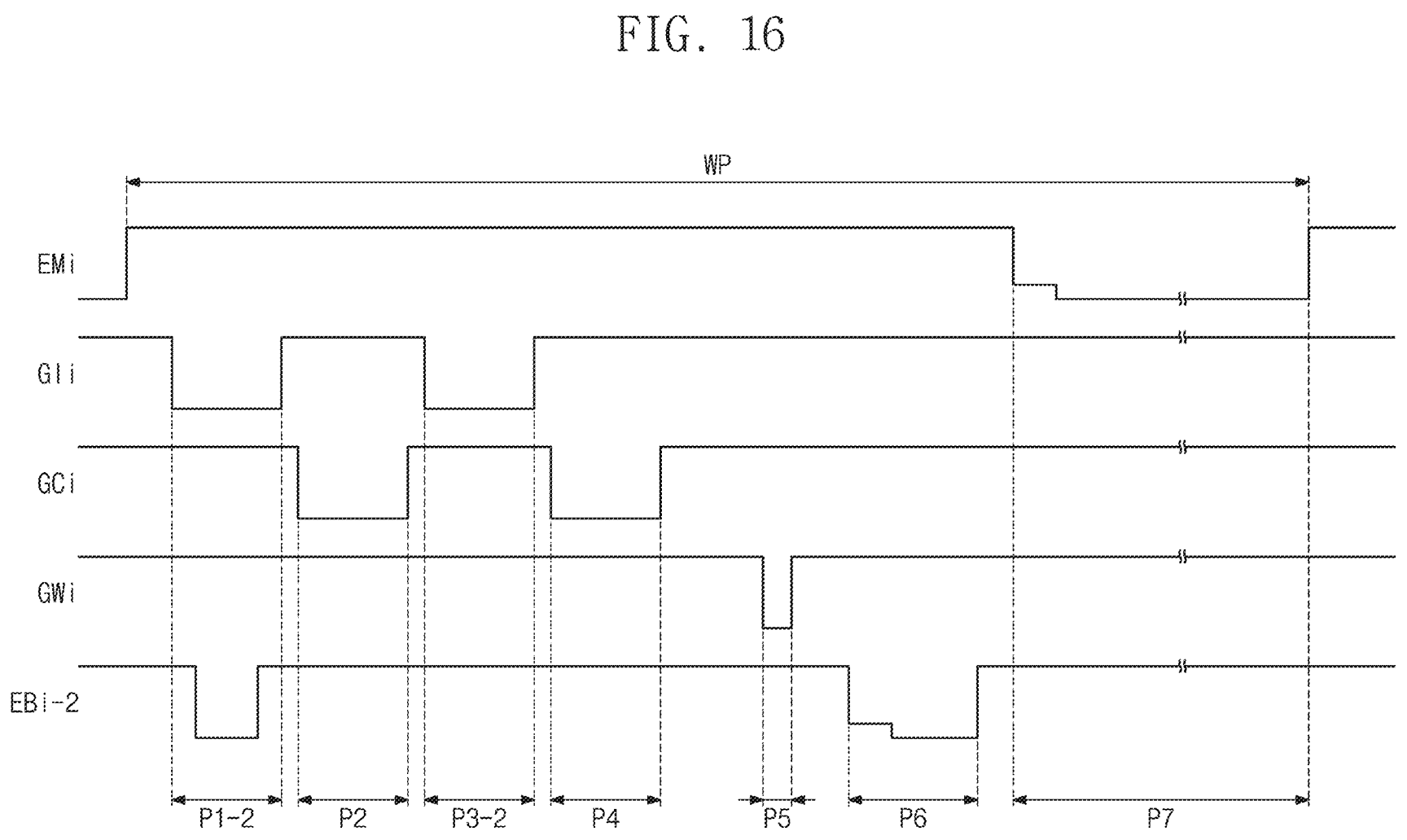

FIG. 16 is a timing diagram for describing an operation of a pixel according to an embodiment of the present disclosure. In the description of FIG. 16, the signals and periods which are described with reference to FIG. 8 are marked by the same reference characters, and thus, additional description will be omitted to avoid redundancy.

Referring to FIGS. 5 and 16, the write period WP may include first to seventh periods P1-2, P2, P3-2, P4, P5, P6, and P7.

During the first period P1-2 of the write period WP, the scan signals GCi and GWi and the emission signal EMi are at the inactive level (e.g., the high level), and scan signals GIi and EBi-2 are at the active level (e.g., the low level).

During the third period P3-2 of the write period WP, the scan signals GCi, GWi, and EBi-2 and the emission signal EMi are at the inactive level (e.g., the high level), and the scan signal GIi is at the active level (e.g., the low level).

According to the present disclosure, as the scan signal EBi-2 is activated in the first period P1-2, in the fourth period P4, the third node N3 being the source electrode of the first transistor T1 may be not in the floating state but in a state where the bias voltage Vbias is applied to the source electrode of the first transistor T1. In this case, there may be prevented the shift of threshold voltage Vth of the first transistor T1, which is caused when the third node N3 is in the floating state. The bias voltage Vbias may be applied to the third node N3 in the first period P1-2, and as the first transistor T1 operates as a source follower in the fourth period P4, a voltage of an accurate level, that is, "ELVDD−Vth" may be applied to the gate electrode of the first transistor T1. Accordingly, the pixel PXij with improved reliability and the display device DD (refer to FIG. 1) including the same may be provided.

Figure 17:
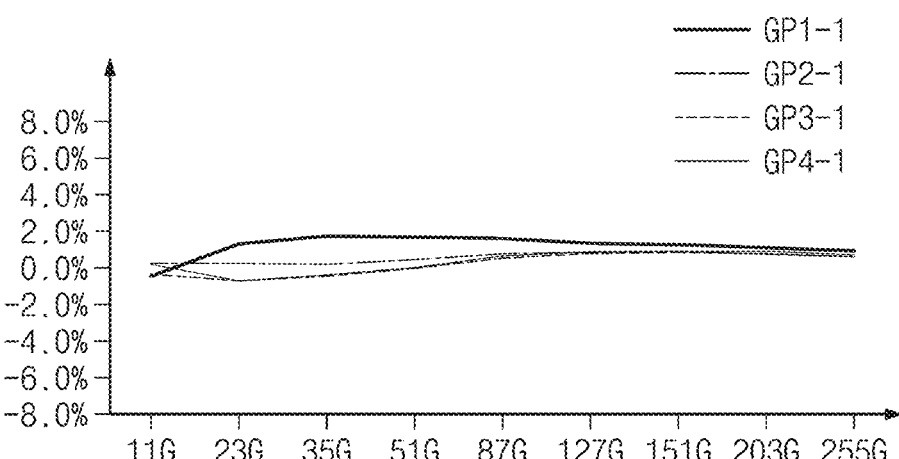
FIG. 17 is a graph illustrating a relationship between G-values and gray levels, according to an embodiment of the present disclosure.
Figure 18:
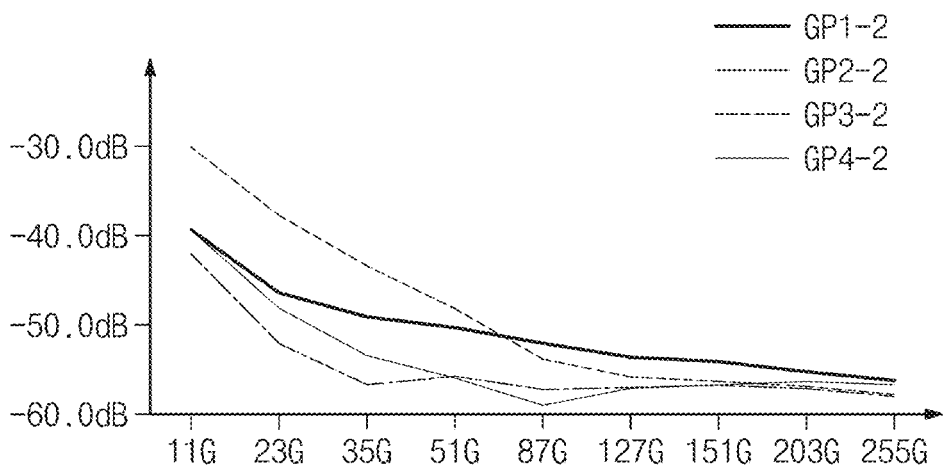
FIG. 18 is a graph illustrating a relationship between JEITA value and gray levels, according to an embodiment of the present disclosure.

FIG. 17 is a graph illustrating a relationship between G-values and gray levels, according to an embodiment of the present disclosure, and FIG. 18 is a graph illustrating a relationship between JEITA values and gray levels, according to an embodiment of the present disclosure.

Referring to FIGS. 17 and 18, first graphs GP1-1 and GP1-2 show embodiments in which the bias voltage Vbias is not applied to the third node N3, second graphs GP2-1 and GP2-2 show embodiments in which the pixel PXij is driven based on the timing illustrated in FIG. 8, third graphs GP3-1 and GP3-2 show embodiments in which the pixel PXij is driven based on the timing illustrated in FIG. 15, and fourth graphs GP4-1 and GP4-2 show an embodiment in which the pixel PXij is driven based on the timing shown in FIG. 16.

TABLE 6

|        | 11G     | 23G     | 35G     | 51G   | 87G   | 127G  | 151G  | 203G  | 255G  |
|--------|---------|---------|---------|-------|-------|-------|-------|-------|-------|
| GP1-1  | −0.38%  | 1.50%   | 1.84%   | 1.87% | 1.79% | 1.52% | 1.43% | 1.22% | 1.05% |
| GP2-1  | 0.34%   | 0.40%   | 0.35%   | 0.59% | 0.94% | 0.99% | 0.98% | 0.93% | 0.80% |
| GP3-1  | −0.26%  | −0.60%  | −0.40%  | 0.07% | 0.64% | 0.97% | 0.96% | 1.00% | 0.88% |
| GP4-1  | 0.28%   | −0.65%  | −0.33%  | 0.11% | 0.74% | 0.96% | 1.03% | 1.02% | 0.89% |

Table 6 shows values which the first to fifth graphs GP1-1, GP2-1, GP3-1, and GP4-1 have for each gray level. Referring to Table 6 and FIGS. 5, 8, 15, 16, and 17, as the scan signal EBi is activated during the first period P1-1/P1-2 or the third period P3, the bias voltage Vbias may be applied to the third node N3 which is the source electrode of the first transistor T1.

According to the present disclosure, the phenomenon that the threshold voltage Vth is shifted in the fourth period P4 may be prevented by the first period P1-1/P1-2 or the third period P3. At each gray level, the G-value deviation for each driving frequency may be appropriately 1%. That is, the G-value deviation for each driving frequency may be improved. Accordingly, the display device DD (refer to FIG. 2) with improved display quality may be provided.

a first electrode of a light emitting element ED through a sixth transistor T6-1, a gate electrode connected to a first node N1-1.

The second transistor T2-1 includes a first electrode connected to the data line DLj, a second electrode connected to a second node N2-1, and a gate electrode connected to the scan line GWLi. The second transistor T2-1 may be turned on depending on the scan signal GWi transferred through the scan line GWLi and may transfer the data signal Dj transferred from the data line DLj to the second node N2-1.

The third transistor T3-1 includes a first electrode connected to the second electrode of the first transistor T1-1, a second electrode connected to the first node N1-1, and a gate electrode connected to the scan line GCLi. The third transistor T3-1 may include a plurality of transistors connected

TABLE 7

|        | 11G       | 23G       | 35G       | 51G       | 87G       | 127G      | 151G      | 203G      | 255G      |
|--------|-----------|-----------|-----------|-----------|-----------|-----------|-----------|-----------|-----------|
| GP1-2  | −39.4 dB  | −46.6 dB  | −49.0 dB  | −50.4 dB  | −52.1 dB  | −53.5 dB  | −54.1 dB  | −55.2 dB  | −56.3 dB  |
| GP2-2  | −42.0 dB  | −52.2 dB  | −56.6 dB  | −55.8 dB  | −57.4 dB  | −57.0 dB  | −56.6 dB  | −57.2 dB  | −58.0 dB  |
| GP3-2  | −29.5 dB  | −37.7 dB  | −43.4 dB  | −48.2 dB  | −53.8 dB  | −55.9 dB  | −56.4 dB  | −56.9 dB  | −57.9 dB  |
| GP4-2  | −39.2 dB  | −48.1 dB  | −53.6 dB  | −56.1 dB  | −59.1 dB  | −57.2 dB  | −56.8 dB  | −56.4 dB  | −56.7 dB  |

Table 7 shows JEITA values which the first to fourth graphs GP1-2, GP2-2, GP3-2, and GP4-2 have for each gray level. Referring to Table 7 and FIGS. 5, 8, 15, 16, and 18, as the scan signal EBi is activated during the first period P1-1/P1-2 or the third period P3, the bias voltage Vbias may be applied to the third node N3 which is the source electrode of the first transistor T1-1.

According to the present disclosure, the phenomenon that the threshold voltage Vth is shifted in the fourth period P4 may be prevented by the first period P1-1/P1-2 or the third period P3. In this case, when the gray level is 87G or more, the JEITA value may be improved compared to a comparative example. That the JEITA value decreases may mean that the flicker is improved. That is, when the pixel PXij is driven based on the timing diagrams of FIGS. 15 and 16, the JEITA value may be improved in a high grayscale zone. Accordingly, the display device DD (refer to FIG. 2) with improved display quality may be provided.

Figure 19A:
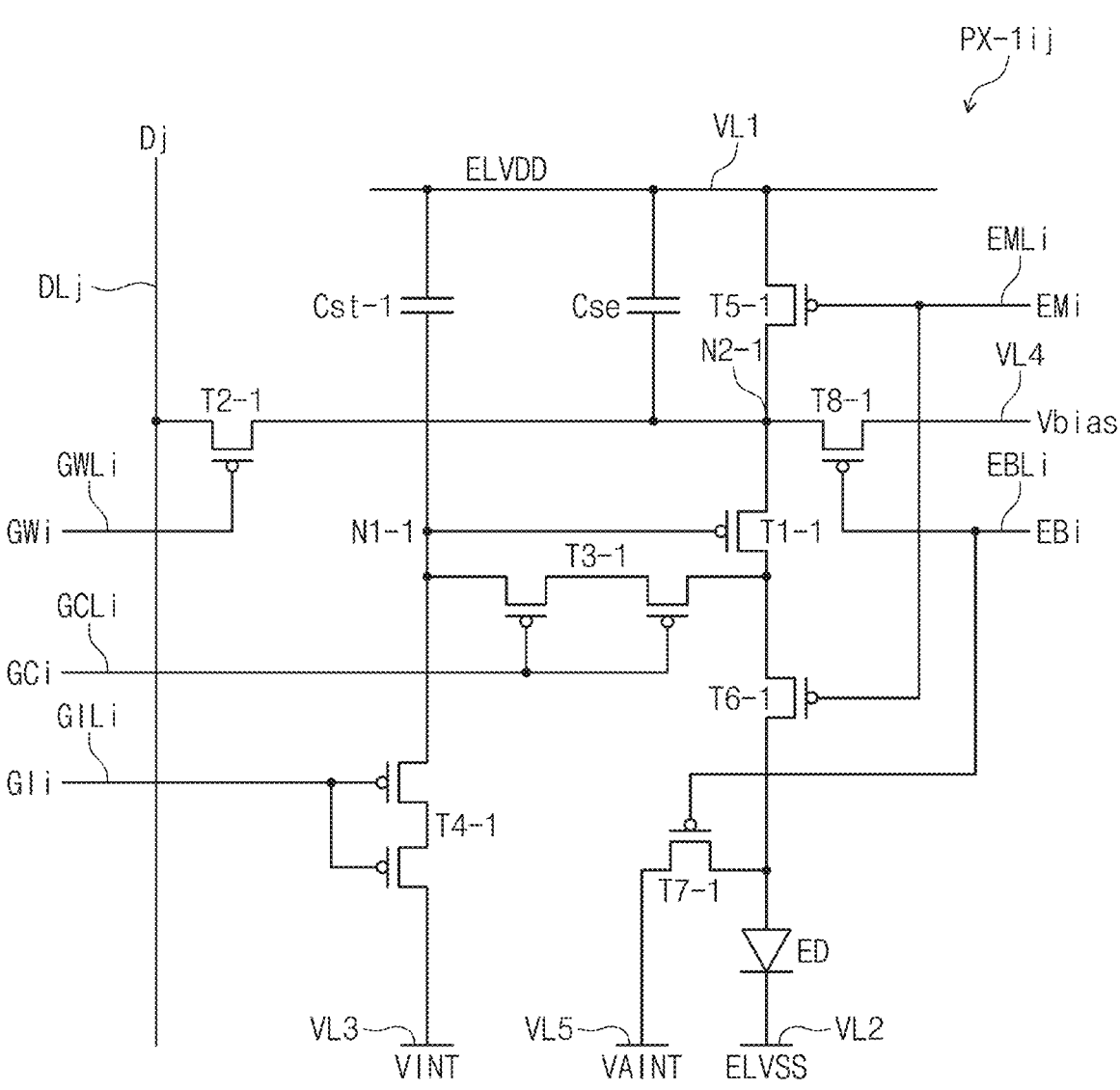
FIG. 19A is a circuit diagram of a pixel according to an embodiment of the present disclosure.
Figure 19B:
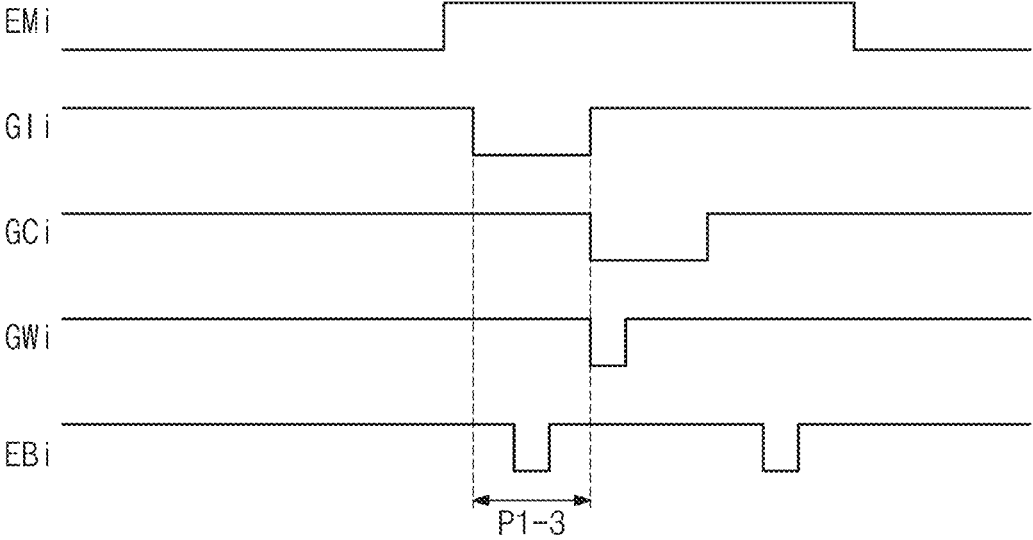
FIG. 19B is a timing diagram for describing an operation of a pixel according to an embodiment of the present disclosure.

FIG. 19A is a circuit diagram of a pixel according to an embodiment of the present disclosure, and FIG. 19B is a timing diagram for describing an operation of a pixel according to an embodiment of the present disclosure. In the description of FIG. 19A, the components that are described with reference to FIG. 5 are marked by the same reference characters, and thus, additional description will be omitted to avoid redundancy.

Referring to FIG. 19A, a pixel circuit of a pixel PX-1ij includes 8 transistors T1-1 to T8-1, a first capacitor Cst-1, and a second capacitor Cse.

The first transistor T1-1 may include a first electrode connected to the first voltage line VL1 through the fifth transistor T5-1, a second electrode electrically connected to in series. The third transistor T3-1 may be turned on depending on the scan signal GCi transferred through the scan line GCLi and may connect the first node N1-1, that is, the gate electrode of the first transistor T1-1 and the second electrode of the first transistor T1-1.

The fourth transistor T4-1 may include a first electrode connected to the first node N1-1, a second electrode connected to the third voltage line VL3, and a gate electrode connected to the scan line GILi. The fourth transistor T4-1 may include a plurality of transistors connected in series. The fourth transistor T4-1 may be turned on depending on the scan signal GIi transferred through the scan line GILi and may transfer the first initialization voltage VINT to the first node N1-1, that is, the gate electrode of the first transistor T1-1.

The fifth transistor T5-1 may include a first electrode connected to the first voltage line VL1, a second electrode connected to the first electrode of the first transistor T1-1, and a gate electrode connected to the emission line EMLi.

The sixth transistor T6-1 may include a first electrode connected to the second electrode of the first transistor T1-1, a second electrode connected to the first electrode of the light emitting element ED, and a gate electrode connected to the emission line EMLi.

The fifth transistor T5-1 and the sixth transistor T6-1 may be simultaneously turned on depending on the emission signal EMi transferred through the emission line EMLi. When the fifth transistor T5-1 and the sixth transistor T6-1 are turned on, a current path may be formed between the first voltage line VL1 and the light emitting element ED through the fifth transistor T5-1, the first transistor T1-1, and the sixth transistor T6-1.

The seventh transistor T7-1 includes a first electrode connected to the first electrode of the light emitting element ED, a second electrode connected to the fifth voltage line VL5, and a gate electrode connected to the scan line EBLi. The seventh transistor T7-1 may be turned on depending on the scan signal EBi transferred through the scan line EBLi and may initialize the first electrode of the light emitting element ED with the second initialization voltage VAINT of the fifth voltage line VL5.

The eighth transistor T8-1 may include a first electrode connected to the fourth voltage line VL4, a second electrode connected to the first electrode of the first transistor T1-1, and a gate electrode connected to the scan line EBLi. The eighth transistor T8-1 may be turned on depending on the scan signal EBi transferred through the scan line EBLi and may transfer the bias voltage Vbias to the first electrode of the first transistor T1-1.

The first capacitor Cst-1 may be connected between the first voltage line VL1 and the first node N1-1.

The second capacitor Cse may be connected between the first voltage line VL1 and the second node N2-1.

During an initialization period P1-3, the scan signals GCi and GWi and the emission signal EMi are at the inactive level (e.g., the high level), and the scan signals GIi and EBi are at the active level (e.g., the low level).

The fourth transistor T4-1 is turned on in response to the scan signal GIi of the active level. In this case, during the initialization period P1-3, the first initialization voltage VINT may be transferred to the first node N1-1 through the fourth transistor T4-1.

The seventh transistor T7-1 is turned on in response to the scan signal EBi of the active level. In this case, during the initialization period P1-3, the second initialization voltage VAINT may be transferred to the first electrode of the light emitting element ED through the seventh transistor T7-1.

The eighth transistor T8-1 is turned on in response to the scan signal EBi of the active level. In this case, during the initialization period P1-3, the bias voltage Vbias may be transferred to the first node N2-1 through the eighth transistor T8-1.

The hysteresis effect due to a characteristic change in the threshold voltage Vth of the first transistor T1-1 may be minimized by providing the bias voltage Vbias to the first electrode of the first transistor T1-1.

According to the present disclosure, the bias voltage Vbias may be applied to the second node N2-1 being the source electrode of the first transistor T1-1 through the scan signal EBi activated during the initialization period P1-3. An environment in which the pixel PX-1ij performs a desired function based on an operating point may be implemented by the bias voltage Vbias. Accordingly, the pixel PX-1ij with improved reliability and the display device DD (refer to FIG. 1) including the same may be provided. Also, the second node N2-1 being the source electrode of the first transistor T1-1 may be not in the floating state but in a state where the bias voltage Vbias is applied thereto. In this case, there may be prevented the shift of threshold voltage Vth of the first transistor T1, which is caused when the third node N3-1 is in the floating state. The bias voltage Vbias may be applied to the second node N2-1 in the initialization period P1-3; then, as the first transistor T1-1 operates as a source follower, a voltage of an accurate level, that is, "ELVDD–Vth" may be applied to the gate electrode of the first transistor T1-1. Accordingly, the pixel PX-1ij with improved reliability and the display device DD (refer to FIG. 1) including the same may be provided.

As described above, as a scan signal is activated in an initialization period of a pixel, in a compensation period, a source electrode of a first transistor may be not in a floating state but in a state where a bias voltage is applied thereto. Accordingly, there may be prevented the shift of a threshold voltage Vth of the first transistor, which is caused when the source electrode is in the floating state. The bias voltage may be applied to the source electrode in the initialization period, and as the first transistor operates as a source follower in the compensation period, a voltage of "(ELVDD–Vth)" may be applied to a gate electrode of the first transistor. During the compensation period, the threshold voltage Vth of the first transistor may be compensated for. Accordingly, the influence which the threshold voltage Vth of the first transistor experiences during an emission period may be removed, and a current proportional to a voltage of a data signal may be provided to a light emitting element. Accordingly, a pixel with improved display quality and a display device including the same may be provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A pixel comprising:
a light emitting element including a first electrode electrically connected to a first voltage line through which a first driving voltage is provided, a second electrode electrically connected to a second voltage line through which a second driving voltage whose voltage level is lower than a voltage level of the first driving voltage is provided;
a first capacitor connected between a first node and a second node;
a first transistor including a first electrode connected to a third node, a second electrode electrically connected to the first electrode of the light emitting element, and a gate electrode connected to the first node;
a second transistor including a first electrode connected to the first node, a second electrode connected to a third voltage line, and a gate electrode connected to a first scan line;
a third transistor including a first electrode connected to the first electrode of the light emitting element, a second electrode connected to a fifth voltage line, and a gate electrode connected to a second scan line;
a fourth transistor including a first electrode connected to a fourth voltage line, a second electrode connected to the third node, and a gate electrode connected to the second scan line;
a fifth transistor including a first electrode connected to the first voltage line, a second electrode connected to the third node, and a gate electrode connected to a third scan line;
a sixth transistor including a first electrode connected to the second electrode of the first transistor, a second electrode connected to the first node, and a gate electrode connected to the third scan line;
a seventh transistor including a first electrode connected to the sixth voltage line through which a reference voltage is provided, a second electrode connected to the second node, and a gate electrode connected to the third scan line; and an eighth transistor including a first electrode connected to a data line, a second electrode connected to the second node, and a gate electrode connected to a fourth scan line, wherein, during a first initialization period, a first scan signal provided to the first scan line and a second scan signal provided to the second scan line are at an active level, and wherein, during the first initialization period, a bias voltage is provided from the fourth voltage line to the third node.

2. The pixel of claim 1, wherein, in the first initialization period, a width of a second activation period of the second scan signal is narrower than a width of a first activation period of the first scan signal.

3. The pixel of claim 1, wherein, during the first initialization period, a first initialization voltage is provided from the third voltage line to the first node.

4. The pixel of claim 1, wherein, during the first initialization period, a second initialization voltage is provided from the fifth voltage line to the first electrode of the light emitting element.

5. The pixel of claim 1, wherein each of the second transistor and the sixth transistor includes a plurality of transistors connected in series.

6. The pixel of claim 1, further comprising:

a ninth transistor including a first electrode connected to the first voltage line, a second electrode connected to the third node, and a gate electrode connected to an emission line; and a tenth transistor including a first electrode connected to the second electrode of the first transistor, a second electrode connected to the first electrode of the light emitting element, and a gate electrode connected to the emission line.

7. The pixel of claim 6, wherein, during a compensation period, a third scan signal provided to the third scan line is at the active level, and the first driving voltage is provided to the first node through the fifth transistor, the first transistor, and the sixth transistor.

8. The pixel of claim 7, wherein the first initialization period and the compensation period are alternately repeated plural times.

9. The pixel of claim 8, wherein a plurality of first initialization periods include a (1-1)-th initialization period and a (1-2)-th initialization period provided following the (1-1)-th initialization period, wherein, during the (1-1)-th initialization period, the bias voltage has a first voltage level, and wherein, during the (1-2)-th initialization period, the bias voltage has a second voltage level higher than the first voltage level.

10. The pixel of claim 7, wherein, during a second initialization period, the first scan signal is at the active level.

11. The pixel of claim 10, wherein the compensation period is disposed between the first initialization period and the second initialization period.

12. The pixel of claim 7, wherein, during a data write period provided following the first initialization period and the compensation period, a fourth scan signal provided to the fourth scan line is at the active level.

13. The pixel of claim 12, wherein, during a bias period provided following the data write period, the second scan signal is at the active level.

14. The pixel of claim 13, wherein, during an emission period provided following the bias period, an emission signal provided to the emission line is at the active level, and wherein, during the emission period, the light emitting element emits a light.

15. A display device comprising:

a display panel including a pixel connected to a plurality of scan lines, an emission line, and a data line;

a driving circuit configured to drive the plurality of scan lines and the emission line in response to a scan control signal;

a driving controller configured to output the scan control signal; and a voltage generator configured to generate a plurality of driving voltages, wherein the pixel includes:

a light emitting element including a first electrode electrically connected to a first voltage line through which a first driving voltage is provided, a second electrode electrically connected to a second voltage line through which a second driving voltage whose voltage level is lower than a voltage level of the first driving voltage is provided;

a first capacitor connected between a first node and a second node;

a first transistor including a first electrode connected to a third node, a second electrode electrically connected to the first electrode of the light emitting element, and a gate electrode connected to the first node;

a second transistor including a first electrode connected to the first node, a second electrode connected to a third voltage line through which a first initialization voltage is provided, and a gate electrode connected to a first scan line;

a third transistor including a first electrode connected to the first electrode of the light emitting element, a second electrode connected to a fifth voltage line through which a second initialization voltage is provided, and a gate electrode connected to a second scan line;

a fourth transistor including a first electrode connected to a fourth voltage line, a second electrode connected to the third node, and a gate electrode connected to the second scan line;

a fifth transistor including a first electrode connected to the first voltage line, a second electrode connected to the third node, and a gate electrode connected to a third scan line;

a sixth transistor including a first electrode connected to the second electrode of the first transistor, a second electrode connected to the first node, and a gate electrode connected to the third scan line;

a seventh transistor including a first electrode connected to a sixth voltage line through which a reference voltage is provided, a second electrode connected to the second node, and a gate electrode connected to the third scan line; and an eighth transistor including a first electrode connected to the data line, a second electrode connected to the second node, and a gate electrode connected to a fourth scan line, wherein, during a first initialization period, a first scan signal provided to the first scan line and a second scan signal provided to the second scan line are at an active level, and wherein, during the first initialization period, a bias voltage is provided from the fourth voltage line to the third node.

16. The display device of claim 15, wherein, during the first initialization period, a first initialization voltage is provided from the third voltage line to the first node, and a second initialization voltage is provided from the fifth voltage line to the first electrode of the light emitting element.

17. The display device of claim 15, wherein each of the second transistor and the sixth transistor includes a plurality of transistors connected in series.

18. The display device of claim 16, wherein the pixel further includes:

a ninth transistor including a first electrode connected to the first voltage line, a second electrode connected to the third node, and a gate electrode connected to the emission line; and a tenth transistor including a first electrode connected to the second electrode of the first transistor, a second electrode connected to the first electrode of the light emitting element, and a gate electrode connected to the emission line.

19. The display device of claim 18, wherein, during a compensation period, a third scan signal provided to the third scan line is at the active level, and the first driving voltage is provided to the first node through the fifth transistor, the first transistor, and the sixth transistor.

20. The display device of claim 19, wherein the first initialization period and the compensation period are alternately repeated plural times, wherein a plurality of first initialization periods include a (1-1)-th initialization period and a (1-2)-th initialization period provided following the (1-1)-th initialization period, wherein, during the (1-1)-th initialization period, the bias voltage has a first voltage level, and wherein, during the (1-2)-th initialization period, the bias voltage has a second voltage level higher than the first voltage level.

21. An electronic device comprising the display device of claim 15.

* * * * *